United States Patent
Kim et al.

(10) Patent No.: US 9,018,623 B2
(45) Date of Patent: Apr. 28, 2015

(54) ARRAY SUBSTRATE, DISPLAY PANEL HAVING THE SAME AND METHOD OF MANUFACTURING THE ARRAY SUBSTRATE

(71) Applicant: Samsung Display Co., Ltd., Yongin (KR)

(72) Inventors: Duk-Sung Kim, Ansan-si (KR); Sung-Haeng Cho, Chungcheongbuk-do (KR)

(73) Assignee: Samsung Display Co., Ltd., Yongin (KR)

( * ) Notice: Subject to any disclaimer, the term of this patent is extended or adjusted under 35 U.S.C. 154(b) by 68 days.

(21) Appl. No.: 13/674,360

(22) Filed: Nov. 12, 2012

(65) Prior Publication Data
US 2014/0001463 A1    Jan. 2, 2014

(30) Foreign Application Priority Data
Jun. 28, 2012  (KR) .......... 10-2012-0069824

(51) Int. Cl.
*H01L 33/58* (2010.01)
*H01L 33/18* (2010.01)
*H01L 33/00* (2010.01)
*H01L 27/12* (2006.01)

(52) U.S. Cl.
CPC ............ *H01L 33/0041* (2013.01); *H01L 33/18* (2013.01); *H01L 33/58* (2013.01); *H01L 27/124* (2013.01); *H01L 27/1225* (2013.01)

(58) Field of Classification Search
CPC ................... H01L 29/66742; H01L 29/42384; H01L 27/1251
USPC .......................... 257/72, 43, 59, 107, E33.012
See application file for complete search history.

(56) References Cited

U.S. PATENT DOCUMENTS

| | | | |
|---|---|---|---|
| 7,656,500 B2 | 2/2010 | Ahn | |
| 7,830,464 B2 | 11/2010 | Song et al. | |
| 2010/0159624 A1* | 6/2010 | Cho et al. | 438/34 |
| 2013/0001545 A1* | 1/2013 | Kuwabara et al. | 257/43 |
| 2014/0186998 A1* | 7/2014 | Koezuka et al. | 438/104 |

FOREIGN PATENT DOCUMENTS

KR    1020070076149    7/2007

* cited by examiner

*Primary Examiner* — Cathy N Lam
(74) *Attorney, Agent, or Firm* — F. Chau & Associates, LLC

(57) ABSTRACT

An array substrate includes a thin film transistor which includes a gate electrode electrically connected to a gate line, a source electrode electrically connected to a data line, a drain electrode and an active layer, a first electrode electrically connected to the drain electrode and disposed at a pixel area, and a second electrode covering an upper and a side surface of the source electrode. The second electrode is spaced apart from the first electrode.

14 Claims, 18 Drawing Sheets

ARRAY SUBSTRATE, DISPLAY PANEL HAVING THE SAME AND METHOD OF MANUFACTURING THE ARRAY SUBSTRATE

CROSS-REFERENCE TO RELATED APPLICATION

This application claims priority to Korean Patent Application No. 10-2012-0069824, filed on Jun. 28, 2012, the disclosure of which is hereby incorporated by reference herein in its entirety.

1. Technical Field

Example embodiments of the invention relate to an array substrate, a display panel having the array substrate and a method of manufacturing the array substrate.

More particularly, example embodiments of the present invention relate to an array substrate for a liquid crystal display apparatus, a display panel having the array substrate and a method of manufacturing the array substrate.

2. Discussion of the Related Art

Recently, a liquid display apparatus having light weight and small size has been manufactured. A cathode ray tube (CRT) display apparatus has been used due to a performance and a competitive price. However, the CRT display apparatus may have deficiencies with regard to size or portability. Therefore the, liquid display apparatus has been highly regarded due to its small size, light weight and low-power-consumption.

The display apparatus includes a thin film transistor having an active layer. The thin film transistor may include, for example, a source electrode and a drain electrode contacting the active layer. However, surfaces of the source and drain electrode may be exposed to the active layer during a manufacturing process, and thus the active layer may be contaminated.

SUMMARY OF THE INVENTION

Example embodiments of the invention provide an array substrate capable of increasing an aperture ratio and reliability, and capable of simplifying a manufacturing process.

Example embodiments of the invention also provide a display panel having the array substrate.

Example embodiments of the invention also provide a method of manufacturing the array substrate.

According to an example embodiment of the invention, an array substrate includes a thin film transistor which includes a gate electrode electrically connected to a gate line, a source electrode electrically connected to a data line, a drain electrode and an active layer, a first electrode electrically connected to the drain electrode and disposed at a pixel area, and a second electrode covering an upper surface and a side surface of the source electrode. The second electrode is spaced apart from the first electrode.

In an example embodiment, the second electrode may make contact with the source electrode.

In an example embodiment, the first electrode and the second electrode may include a same material as each other.

In an example embodiment, the first electrode may cover an upper and a side surface of the drain electrode.

In an example embodiment, the array substrate may further include a first insulating layer disposed on the gate line and the gate electrode, and a second insulating layer disposed on the first electrode and the second electrode. The first insulating layer may insulate the gate line and the gate electrode. The second insulating layer may insulate the first electrode and the second electrode. The gate line may include a lower gate line including at least one of gallium doped zinc oxide (GZO) or indium doped zinc oxide (IZO), and an upper gate line including copper (Cu). The data line may include a lower data line including at least one of gallium doped zinc oxide (GZO) or indium doped zinc oxide (IZO), and an upper data line including copper (Cu). The first insulating layer may include a lower first insulating layer including silicon nitride (SiNx), and an upper first insulating layer including silicon oxide (SiOx). The second insulating layer may include lower second insulating layer including silicon oxide (SiOx), and an upper second insulating layer including silicon nitride (SiNx).

In an example embodiment, the array substrate may further include a third electrode disposed on the second insulating layer. The third electrode may have a slit pattern.

In an example embodiment, the array substrate may further include a third electrode disposed under the first insulating layer. The first electrode may have a slit pattern.

In an example embodiment, the drain electrode and the first electrode may be formed from a same layer as each other.

In an example embodiment, the active layer may include amorphous oxide including at least one selected from the group consisting of indium (In), zinc (Zn), gallium (Ga), tin (Sn) and hafnium (Hf).

In an example embodiment, a portion of the active layer may be disposed on the second electrode.

According to another example embodiment of the invention, an array substrate includes a gate line disposed on a substrate, a first insulating layer disposed on the gate line, a data line disposed on the first insulating layer, a first electrode disposed on the first insulating layer, and partially overlapping with the gate line, a second electrode disposed on the first insulating layer, electrically connected to the data line, spaced apart from the first electrode, and partially overlapping with the gate line, an active layer connecting the first electrode to the second electrode, and overlapping with the gate line, and a second insulating layer disposed on the first electrode, the second electrode and the active layer.

In an example embodiment, the first electrode and the second electrode may be formed from a same layer as each other.

According to an example embodiment of the invention, a method of manufacturing an array substrate includes forming gate pattern on a substrate, forming a first insulating layer on the substrate on which the gate pattern is formed, forming a data pattern including a source electrode on the first insulating layer, forming a first transparent conductive layer covering the source electrode, and patterning the first transparent conductive layer to form a first electrode and a second electrode.

In an example embodiment, the method may further include forming an active layer on the first insulating layer before forming the data pattern.

In an example embodiment, the forming of the active layer and the data pattern may include forming an oxide semiconductive layer on the first insulating layer, forming a metal layer on the oxide semiconductive layer, and patterning the metal layer and the oxide semiconductive layer using a mask having a slit portion.

In an example embodiment, the method may further include forming an active layer connecting the first electrode to the second electrode after forming the first electrode and the second electrode.

In an example embodiment, the forming of the active layer may include forming an amorphous oxide layer on the first insulating layer, the first electrode and the second electrode, the amorphous oxide layer including at least one selected from the group consisting of indium (In), zinc (Zn), gallium (Ga), tin (Sn) and hafnium (Hf), and patterning the amorphous oxide layer to form an active layer disposed on the first electrode and the second electrode, and the active layer connects the first electrode to the second electrode.

In an example embodiment, the method may further include forming a third electrode on the second insulating layer.

In an example embodiment, forming the data pattern may include forming an lower metal layer including gallium doped zinc oxide (GZO) on the first insulating layer, forming an upper metal layer including copper (Cu) on the lower metal layer, and patterning the upper metal layer and the lower metal layer to form the data pattern including the source electrode.

In an example embodiment, the method may further include forming a color filter on the first insulating layer before forming the first transparent conductive layer.

In an example embodiment, a display panel is provided. The display panel includes an array substrate including a thin film transistor including a gate electrode electrically connected to a gate line, a source electrode electrically connected to a data line, a drain electrode and an active layer, a first electrode electrically connected to the drain electrode and disposed at a pixel area in which an image is displayed, and a second electrode covering an upper surface and a side surface of the source electrode, and wherein the second electrode is spaced apart from the first electrode.

In addition, the display panel further includes an opposite substrate facing the array substrate with a black matrix disposed under the opposite substrate and the black matrix overlaps with an area of the array substrate except for the pixel area of the array substrate, a liquid crystal layer disposed between the array substrate and the opposite substrate and liquid crystal molecules of the liquid crystal layer have optical anisotropy and a color filter disposed on one of the opposite substrate or the array substrate.

According to example embodiments of the present invention, an array substrate includes a second electrode, and the second electrode covers a side of a metal layer such as a source electrode, so that a second insulating layer disposed on the metal layer may be formed at a respectively high temperature. Thus, an active layer may be protected from being contaminated by a material from the metal layer. Reliability of the array substrate may thereby be increased.

In addition, a void caused by different etch rates of polarity of metal layers during patterning the metal layers may be reduced, because the second electrode covers the sides of the metal layers. Therefore, a second insulating layer disposed on the second electrode may be uniformly formed.

BRIEF DESCRIPTION OF THE DRAWINGS

Example embodiments of the invention can be understood in more detail from the following detailed description taken in conjunction with the accompanying drawings, in which.

DETAILED DESCRIPTION OF EXAMPLE EMBODIMENTS

Figure 1:
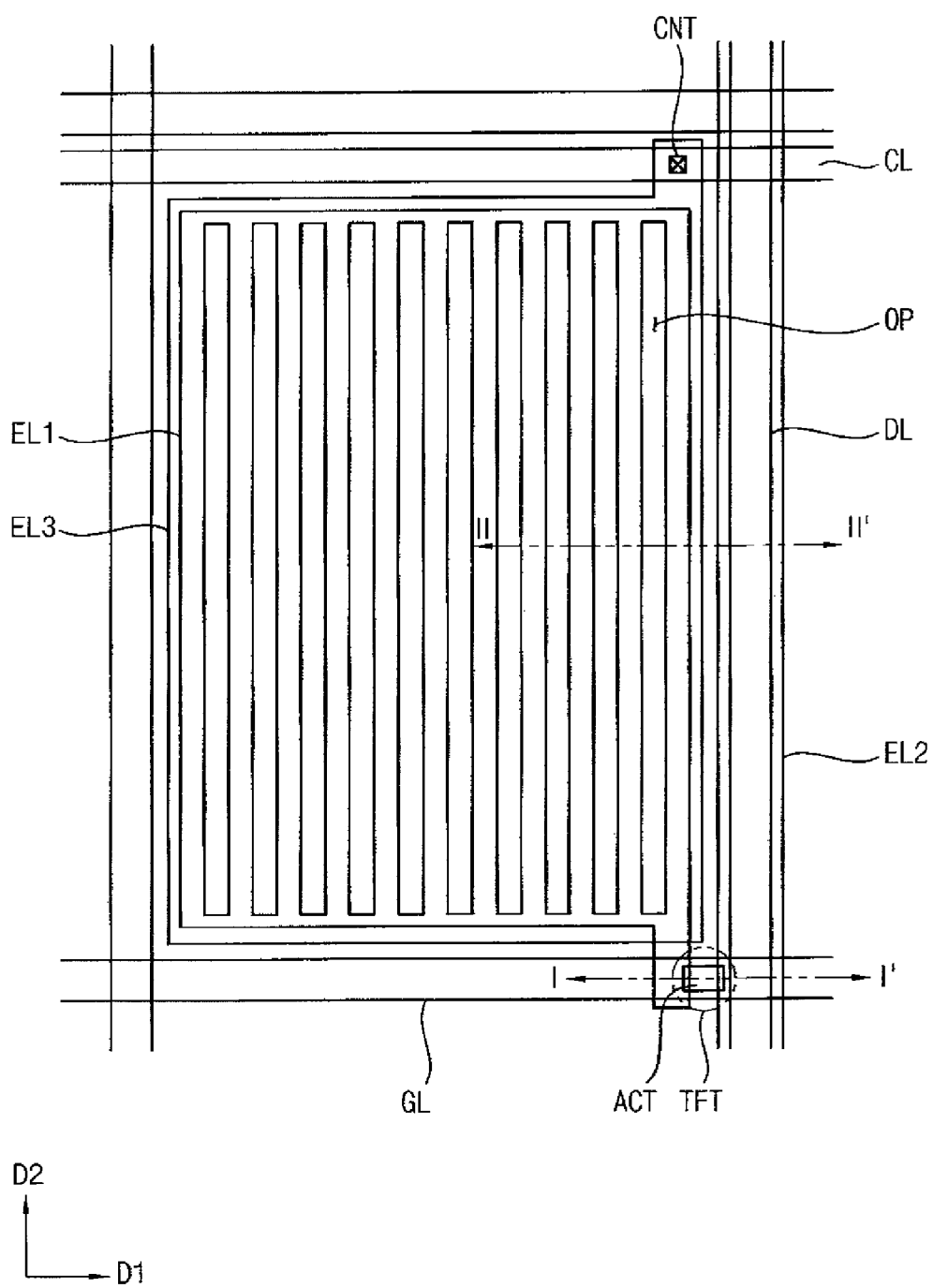
FIG. 1 is a plan view illustrating a display panel according to an example embodiment of the invention.

Hereinafter, example embodiments of the invention will be explained in detail with reference to the accompanying drawings.

In the drawings, the thickness of layers, films, panels, regions, etc., may be exaggerated for clarity. It will be understood that when an element such as, for example, a layer, film, region, or substrate is referred to as being "on", "connected to" or "coupled to" another element, it can be directly on, connected to or coupled to the other element or intervening elements may also be present. Like reference numerals designate like elements throughout the specification.

As used herein, the singular forms, "a", "an", and "the" are intended to include plural forms as well, unless the context clearly indicates otherwise.

Figure 2:
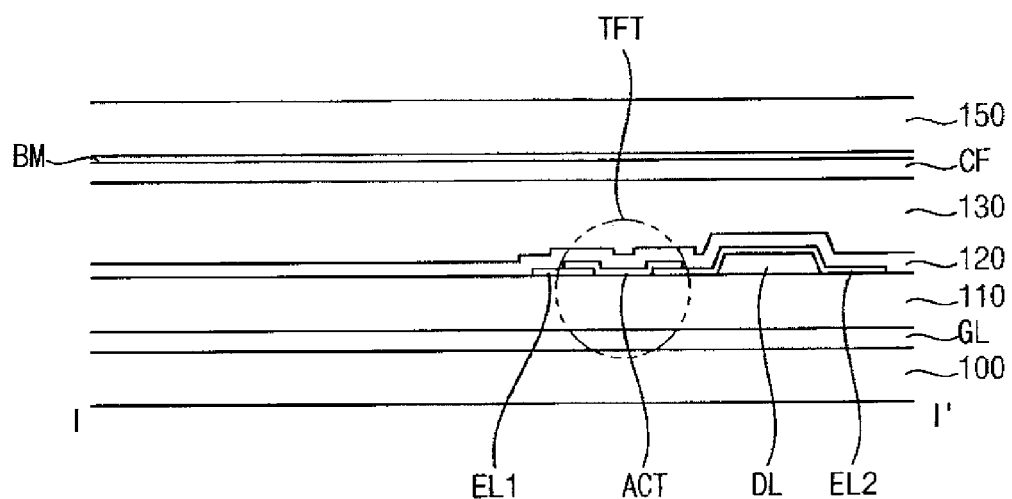
FIG. 2 is a cross-sectional view taken along a line I-I' of FIG. 1.
Figure 3:
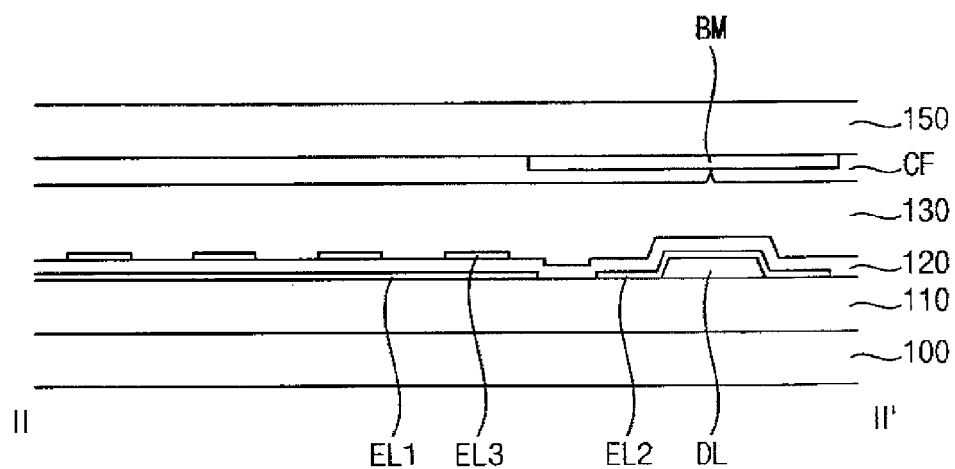
FIG. 3 is a cross-sectional view taken along a line II-II' of FIG. 1.

FIG. 1 is a plan view illustrating a display panel according to an example embodiment of the invention. FIG. 2 is a cross-sectional view taken along a line I-I' of FIG. 1. FIG. 3 is a cross-sectional view taken along a line II-II' of FIG. 1.

Referring FIGS. 1 to 3, the display panel includes an array substrate, an opposite substrate and a liquid crystal layer 130. The array substrate includes, for example, a first substrate 100, a gate line GL, a common line CL, a first insulating layer 110, a data line DL, a first electrode EL1, a second electrode EL2, a thin film transistor TFT, a third electrode EL3 and a second insulating layer 120. The opposite substrate includes, for example, a second substrate 150, a black matrix BM and a color filter CF.

The first substrate 100 may be, for example, a transparent insulation substrate made of, for example, glass, plastic and/or quartz. Further, in an exemplary embodiment, the glass may include, for example, tempered glass. In an exemplary embodiment, the first substrate 100 may be formed of, for example, one of polycarbonate (PC), polyester (PET), polypropylene (PP), polyethylene (PE) and polymethyl methacrylate (PMMA). Alternatively, the first substrate 100 may instead be formed of a non-transparent material such as, for example, a silicon plate or ceramics. The first substrate 100 is subdivided into a plurality of pixel areas. Although only one pixel area is generally described in the figures, the display panel according to example embodiments generally includes a large number of pixel units respectively formed in respective pixel areas. The pixel areas are typically arrayed, for example, as a regular matrix structure having a plurality of rows and columns. The pixel areas typically have the same basic and repeated structures (although some variation for example in color of color filter portion or size or shape of pixel-electrode may occur), so that only one pixel area will be described herein as an example. Although the pixel area has a rectangular shape in the figures, the pixel area may have various modifications in size and/or shape and/or number of field altering slits or other fine features included therein. For example, the pixel areas may have V or Z shapes.

The gate line GL is disposed on the first substrate 100, and extends, for example, in a first direction D1. The gate line GL may include, for example, copper (Cu) and copper oxide (CuOx). In addition, the gate line GL may include, for example, gallium doped zinc oxide (GZO), indium doped zinc oxide (IZO) and/or manganese-copper alloy (CuMn). A portion of the gate line GL forms a gate electrode.

The common line CL is disposed on the first substrate 100, and extends in, for example, the first direction D1. The common line CL may include, for example, the same material as the gate line GL.

The first insulating layer 110 is disposed on the gate line GL and the common line CL, and electrically insulates the gate line GL and the common line CL. The first insulating layer 110 may include, for example, a transparent organic material such as an acrylic resin or benzocyclobutene (BCB) or a transparent inorganic material such as silicon oxide (SiOx), silicon nitride (SiNx) or a combination thereof.

The data line DL is disposed on the first insulating layer 110, and extends, for example, in a second direction D2 substantially perpendicular to the first direction D1. The data line DL may include, for example, copper (Cu) and copper oxide (CuOx). In addition, the data line DL may include, for example, gallium doped zinc oxide (GZO), indium doped zinc oxide (IZO) and/or manganese-copper alloy (CuMn).

Alternatively, for example, in an exemplary embodiment, the data line DL may instead extend in the first direction D1 and the gate line GL and the common line CL may instead extend in the second direction D2 substantially perpendicular to the first direction D1.

The first electrode EL1 is disposed on the first insulating layer 110, and corresponds with the pixel area. The first electrode EL1 may include, for example, a transparent conductive material, such as indium tin oxide (ITO), indium zinc oxide (IZO) and etc. In addition, the first electrode EL1 may include, for example, titanium (Ti) and/or molybdenum titanium (MoTi). A portion of the first electrode EL1 forms a drain electrode adjacent to the data line DL and the gate line GL.

The second electrode EL2 covers the data line DL. The second electrode EL2 is spaced apart from the first electrode EL1. The second electrode EL2 may include, for example, a same material as the first electrode EL1. The second electrode EL2 and the first electrode EL1 may be formed, for example, from a same layer. A portion of the second electrode EL2 forms a source electrode adjacent to the drain electrode.

The gate electrode is disposed under and between the source electrode and the drain electrode. An active layer ACT overlaps with the gate electrode, and connects the drain electrode and the source electrode. The thin film transistor TFT includes, for example, the active layer ACT, the drain electrode, the gate electrode and the source electrode. Thus, the thin film transistor TFT is disposed adjacent to a crossing point of the data line DL and the gate line GL.

The active layer ACT may include, for example, a semiconductor layer consisting of amorphous silicon (a-Si:H) and an ohmic contact layer consisting of n+ amorphous silicon (n+a-Si:H). In addition, the active layer ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO). In addition, the oxide semiconductor may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor.

The active layer ACT is electrically connected to the data line DL through the second electrode EL2. Although the active layer ACT includes the oxide semiconductor and the data line DL includes, for example, copper, the active layer ACT may be protected form being contaminated by a material from the data line DL.

In the present example embodiment, the active layer ACT is disposed on the gate line GL, and the gate electrode is a portion of the gate line GL, so that an aperture ratio may be increased compared with a structure in which a gate electrode is protruded from the gate line GL.

The second insulating layer 120 is disposed on the first electrode EL1, the second electrode EL2 and the active layer ACT. The second insulating layer 120 electrically insulates the first electrode EL1, the second electrode EL2 and the active layer ACT. The second insulating layer 120 may include, for example, a transparent organic material such as acrylic resin or benzocyclobutene (BCB) or transparent inorganic material such as silicon oxide (SiOx), silicon nitride (SiNx), or a combination thereof.

The third electrode EL3 is disposed on the second insulating layer 120, and corresponds to the pixel area. The third electrode EL3 is electrically connected to the common line CL through a contact hole CNT. The contact hole CNT is formed through the first and second insulating layer 110 and 120, and exposes the common line CL. Thus, the third electrode EL3 is electrically connected to the common line CL through the contact hole CNT. The third electrode EL3 may include, for example, a slit pattern having a plurality of openings OP. The third electrode EL3 may include, for example, a transparent conductive material, such as indium tin oxide (ITO), indium zinc oxide (IZO) and etc. In addition, the third electrode EL3 may include, for example, titanium (Ti) and/or molybdenum titanium (MoTi).

The second substrate 150 faces the first substrate 100. The second substrate 150 may be, for example, a transparent insulation substrate made of, for example, glass, plastic and/or quartz. Further, in an exemplary embodiment, the glass may include, for example, tempered glass. In an exemplary embodiment, the second substrate 150 may be formed of, for example, one of polycarbonate (PC), polyester (PET), polypropylene (PP), polyethylene (PE) and polymethyl methacrylate (PMMA). Alternatively, the second substrate 150 may instead be formed of a non-transparent material such as, for example, a silicon plate or ceramics.

The black matrix BM is disposed under the second substrate 150. The black matrix BM corresponds to an area except for the pixel area, and blocks light. Thus, the black matrix BM overlaps with, for example, the data line DL, the gate line GL and the common line CL. Although the black matrix BM overlaps with the data line DL, the gate line GL and the common line CL in the present example embodiment, the black matrix BM may be properly disposed to block the light.

The color filter CF is disposed under the black matrix BM and the second substrate 150. The color filter CF supplies colors to the light passing through the liquid crystal layer 130. The color filter CF may include, for example, a red color filter, a green color filter and blue color filter. The color filter CF corresponds to the pixel area. The color filters CFs adjacent to each other may have different colors than each other. Although the color filter CF is overlapped with adjacent color filter CF in a boundary of the pixel area in the present example embodiment, the color filter CF may be spaced apart from adjacent color filter CF in the boundary of the pixel area.

The liquid crystal layer 130 is disposed between the array substrate and the opposite substrate. The liquid crystal layer 130 includes liquid crystal molecules having, for example, optical anisotropy. The liquid crystal molecules are driven by an electric field, so that an image is displayed by passing or blocking light through the liquid crystal layer 130.

Although the display panel includes the liquid crystal layer 130 in the present example embodiment, the display panel may include an image display layer for displaying an image. For example, the image display layer may be an electrophoresis layer. The electrophoresis layer includes, for example, insulative medium and charge carriers. The insulative medium is a dispersion medium of the dispersed charge carriers. The charge carriers have electrophoresis and are diffused in the insulative medium. The charge carriers move by the electric field, so that an image is displayed by passing or blocking light through the electrophoresis layer.

Figure 4:
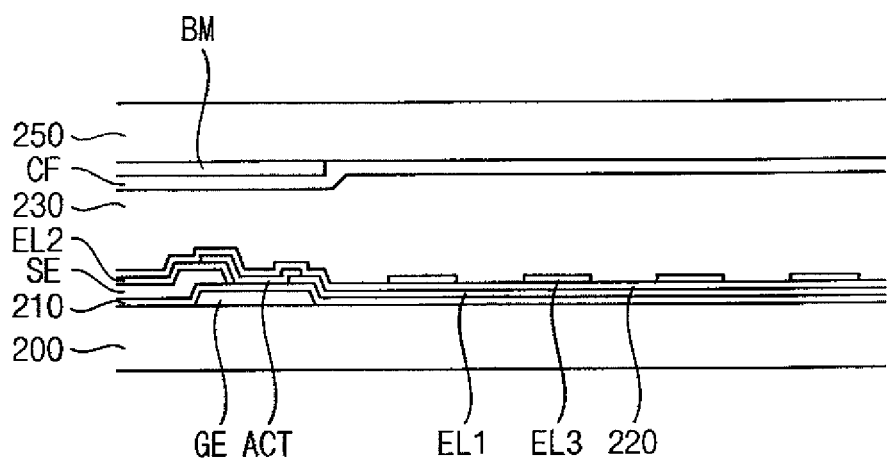
FIG. 4 is a cross-sectional view illustrating a display panel according to an embodiment of the invention.

FIG. 4 is a cross-sectional view illustrating a display panel according to an example embodiment of the invention.

Referring to FIG. 4, the display panel includes, for example, an array substrate, an opposite substrate and a liquid crystal layer 230. The array substrate includes, for example, a first substrate 200, a gate electrode GE, a first insulating layer 210, a source electrode SE, a first electrode EL1, a second electrode EL2, a third electrode EL3 and a second insulating layer 220. The opposite substrate includes, for example, a second substrate 250, a black matrix BM and a color filter CF. The display panel according to the present example embodiment is substantially same as that of the display panel of FIGS. 1 to 3. Thus, only the differences between the display panel of the present example embodiment and the display panel for FIGS. 1 to 3 will be discussed and therefore any further detailed descriptions concerning the same elements will be omitted.

The first substrate 200 may be, for example, a transparent insulation substrate made of, for example, glass plastic, and/or quartz. Further, in an exemplary embodiment, the glass may include, for example, tempered glass. In an exemplary embodiment, the first substrate 200 may be formed of, for example, one of polycarbonate (PC), polyester (PET), polypropylene (PP), polyethylene (PE) and polymethyl methacrylate (PMMA). Alternatively, the first substrate 200 may instead be formed of a non-transparent material such as, for example, a silicon plate or ceramics.

The gate electrode GE is disposed on the first substrate 200. The gate electrode GE may include, for example, copper (Cu) and copper oxide (CuOx). In addition, the gate electrode GE may include, for example, gallium doped zinc oxide (GZO), indium doped zinc oxide (IZO) and/or manganese-copper alloy (CuMn). A gate line (refers to GL of FIG. 1) is disposed on the first substrate 200, and extends, for example, in a first direction (refers to D1 in FIG. 1). The gate electrode GE is electrically connected to the gate line (refers to GL of FIG. 1).

The first insulating layer 210 is disposed on the gate electrode GE, and electrically insulates the gate electrode GE. The first insulating layer 210 may include, for example, a transparent organic material such as an acrylic resin or benzocyclobutene (BCB) or a transparent inorganic material such as silicon oxide (SiOx), silicon nitride (SiNx), or a combination thereof.

The source electrode SE is disposed on the first insulating layer 210. The source electrode SE partially overlaps with the gate electrode GE. The source electrode SE may include copper (Cu) and copper oxide (CuOx). In addition, the source electrode SE may include, for example, gallium doped zinc oxide (GZO), indium doped zinc oxide (IZO) and/or manganese-copper alloy (CuMn). In addition, a data line (refers to DL of FIG. 1) is disposed on the first insulating layer 210, and extends, for example, in a second direction (refers to D2 of FIG. 1) substantially perpendicular to the first direction (refers to D1 of FIG. 1). The source electrode SE is electrically connected to the data line (refers to DL of FIG. 1).

The first electrode EL1 is disposed on the first insulating layer 210, and corresponds to the pixel area. A portion of the first electrode EL1 forms a drain electrode overlapping with the gate electrode GE. The first electrode EL1 may include, for example, a transparent conductive material, such as indium tin oxide (ITO), indium zinc oxide (IZO) and etc. In addition, the first electrode EU may include, for example, titanium (Ti) and/or molybdenum titanium (MoTi).

The second electrode EL2 covers the source electrode SE. The second electrode EL2 is spaced apart from the first electrode EL1. The second electrode EL2 may include, for example, a same material as the first electrode EL1. The second electrode EL2 and the first electrode EL1 may be formed from, for example, the same layer.

The active layer ACT is disposed on the first insulating layer 210, the second electrode EL2 and the drain electrode. The active layer ACT overlaps with the gate electrode GE. The second electrode EL2 is disposed between the source electrode SE and the active layer ACT, so that the active layer ACT may be protected from being contaminated by a material from the source electrode SE. The active layer ACT, the drain electrode, the gate electrode GE and the source electrode SE form a thin film transistor.

The active layer ACT may include, for example, a semiconductor layer consisting of amorphous silicon (a-Si:H) and an ohmic contact layer consisting of n+ amorphous silicon (n+a-Si:H). In addition, the active layer ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO). In addition, the oxide semiconductor may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor.

The second insulating layer 220 is disposed on the first electrode EL1, the second electrode EL2 and the active layer ACT, and electrically insulates the first electrode EL1, the second electrode EL2 and the active layer ACT. The second insulating layer 220 may include, for example, a transparent organic material such as an acrylic resin or benzocyclobutene (BCB) or a transparent inorganic material such as silicon oxide (SiOx), silicon nitride (SiNx), or a combination thereof.

The third electrode EL3 is disposed on the second insulating layer 220, and corresponds to the pixel area. The third electrode EL3 may have, for example, a silt pattern. The third electrode EL3 may include, for example, a transparent conductive material, such as indium tin oxide (ITO), indium zinc oxide (IZO) and etc. In addition, the third electrode EL3 may include, for example, titanium (Ti) and/or molybdenum titanium (MoTi).

The second substrate 250 faces the first substrate 200. The second substrate 250 may be, for example, a transparent insulation substrate made of, for example, glass, plastic and/or quartz. Further, in an exemplary embodiment, the glass may include, for example, tempered glass. In an exemplary embodiment, the second substrate 250 may be formed of, for example, one of polycarbonate (PC), polyester (PET), polypropylene (PP), polyethylene (PE) and polymethyl methacrylate (PMMA). Alternatively, the second substrate 250 may instead be formed of a non-transparent material such as, for example, a silicon plate or ceramics.

The black matrix BM is disposed under the second substrate 250. The black matrix BM overlaps with the thin film transistor, and blocks light.

The color filter CF is disposed under the black matrix BM and the second substrate 250.

The liquid crystal layer 230 is disposed between the array substrate and the opposite substrate. The liquid crystal layer 230 includes liquid crystal molecules having, for example, optical anisotropy. The liquid crystal molecules are driven by an electric field, so that an image is displayed by passing or blocking light through the liquid crystal layer 230.

Figure 5:
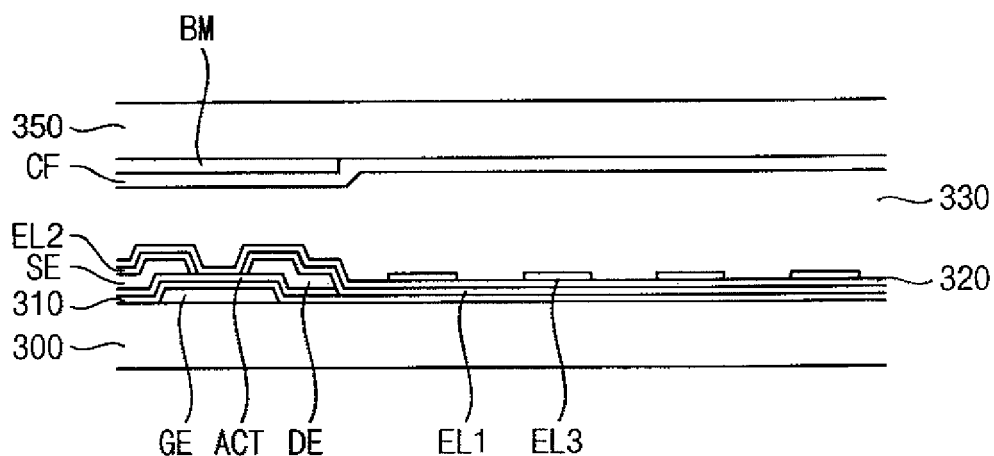
FIG. 5 is a cross-sectional view illustrating a display panel according to an example embodiment of the invention.

FIG. 5 is a cross-sectional view illustrating a display panel according to an example embodiment of the invention.

Referring to FIG. 5, the display panel includes an array substrate, an opposite substrate and a liquid crystal layer 330. The array substrate includes, for example, a first substrate 300, a gate electrode GE, a first insulating layer 310, a source electrode SE, a drain electrode DE, a first electrode EL1, a second electrode EL2, a third electrode EL3 and a second insulating layer 320. The opposite substrate includes, for example, a second substrate 350, a black matrix BM and a color filter CF. The display panel according to the present example embodiment is substantially same as that of the display panel of FIGS. 1 to 3. Thus, only the differences between the display panel of the present example embodiment and the display panel of FIGS. 1 to 3 will be discussed and therefore any further detailed descriptions concerning the same elements will be omitted.

The first substrate 300 may be, for example, a transparent insulation substrate made of, for example, glass, plastic, and/or quartz. Further, in an exemplary embodiment, the transparent glass may include, for example, tempered glass. In an exemplary embodiment, the first substrate 300 may be, for example, one of polycarbonate (PC), polyester (PET), polypropylene (PP), polyethylene (PE) and polymethyl methacrylate (PMMA). Alternatively, the first substrate 300 may instead be formed of a non-transparent material such as, for example, a silicon plate or ceramics.

The gate electrode GE is disposed on the first substrate 300. The gate electrode GE may include, for example, copper (Cu) and copper oxide (CuOx). In addition, the gate electrode GE may include, for example, gallium doped zinc oxide (GZO), indium doped zinc oxide (IZO) and/or manganese-copper alloy (CuMn). A gate line (refers to GL of FIG. 1) is disposed on the first substrate 300, and extends, for example, in a first direction (refers to D1 in FIG. 1). The gate electrode GE is electrically connected to the gate line (refers to GL of FIG. 1).

The first insulating layer 310 is disposed on the gate electrode GE and electrically insulates the gate electrode GE. The first insulating layer 310 may include, for example, a transparent organic material such as an acrylic resin or benzocyclobutene (BCB) or a transparent inorganic material such as silicon oxide (SiOx), silicon nitride (SiNx), or a combination thereof.

The active layer ACT is disposed on the first insulating layer 310. The active layer ACT overlaps with the gate electrode GE.

The active layer ACT may include, for example, a semiconductor layer consisting of amorphous silicon (a-Si:H) and an ohmic contact layer consisting of n+ amorphous silicon (n+a-Si:H). In addition, the active layer ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO). In addition, the oxide semiconductor may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor.

The source electrode SE is disposed on the active layer ACT. The source electrode SE partially overlaps with the gate electrode GE. The source electrode SE may include, for example, copper (Cu) and copper oxide (CuOx). In addition, the source electrode SE may include, for example, gallium doped zinc oxide (GZO), indium doped zinc oxide (IZO) and/or manganese-copper alloy (CuMn). In addition, a data line (refers to DL of FIG. 1) is disposed on the first insulating layer 310, and extends, for example, in a second direction (refers to D2 of FIG. 1) substantially perpendicular to the first direction (refers to D1 of FIG. 1). The source electrode SE is electrically connected to the data line (refers to DL of FIG. 1).

The drain electrode DE is disposed on the active layer ACT. The drain electrode DE partially overlaps with the gate electrode GE, and is spaced apart from the source electrode SE. The drain electrode DE may include, for example, copper (Cu) and copper oxide (CuOx). In addition, the drain electrode DE may include gallium doped zinc oxide (GZO), indium doped zinc oxide (IZO) and/or manganese-copper alloy (CuMn). A boundary of the active layer ACT may coincide with a boundary of the source electrode SE and the drain electrode DE. The active layer ACT, the drain electrode DE, the gate electrode GE and the source electrode SE form a thin film transistor.

The first electrode EL1 is disposed on the first insulating layer 310, and corresponds with the pixel area. The first electrode EL1 covers the drain electrode DE. The first electrode EL1 may include, for example, a transparent conductive material, such as indium tin oxide (ITO), indium zinc oxide (IZO) and etc. In addition, the first electrode EL1 may include, for example, titanium (Ti) and/or molybdenum titanium (MoTi).

The second electrode EL2 covers the source electrode SE. The second electrode EL2 is spaced apart form the first electrode EL1. The second electrode EL2 may include a same material as the first electrode EL1. The second electrode EL2 and the first electrode EL1 may be, for example, formed from the same layer.

The source electrode SE is covered by the second electrode EL2, and the drain electrode DE is covered with the first electrode EL1, so that the active layer ACT may be protected form being contaminated.

The second insulating layer 320 is disposed on the first electrode EL1, the second electrode EL2 and the active layer ACT, and electrically insulates the first electrode EL1, the second electrode EL2 and the active layer ACT. The second insulating layer 320 may include, for example, a transparent organic material such as an acrylic resin or benzocyclobutene (BCB) or a transparent inorganic material such as silicon oxide (SiOx), silicon nitride (SiNx), or a combination thereof.

The third electrode EL3 is disposed on the second insulating layer 320, and corresponds to the pixel area. The third electrode EL3 may have, for example, a silt pattern. The third electrode EL3 may include, for example, a transparent conductive material, such as indium tin oxide (ITO), indium zinc oxide (IZO) and etc. In addition, the third electrode EL3 may include, for example, titanium (Ti) and/or molybdenum titanium (MoTi).

The second substrate 350 faces the first substrate 300. The second substrate 350 may be, for example, a transparent insulation substrate made of, for example, glass, plastic and/or quartz. Further, in an exemplary embodiment, the glass may include, for example, tempered glass. In an exemplary embodiment, the second substrate 350 may be formed of, for example, one of polycarbonate (PC), polyester (PET), polypropylene (PP), polyethylene (PE) and polymethyl methacrylate (PMMA). Alternatively, the second substrate 350 may instead be formed of a non-transparent material such as, for example, a silicon plate or ceramics.

The black matrix BM is disposed under the second substrate 350. The black matrix BM overlaps with the thin film transistor, and blocks light.

The color filter CF is disposed under the black matrix BM and the second substrate 350.

The liquid crystal layer 330 is disposed between the array substrate and the opposite substrate. The liquid crystal layer 330 includes liquid crystal molecules having, for example, optical anisotropy. The liquid crystal molecules are driven by an electric field, so that an image is displayed by passing or blocking light through the liquid crystal layer 330.

Figure 6:
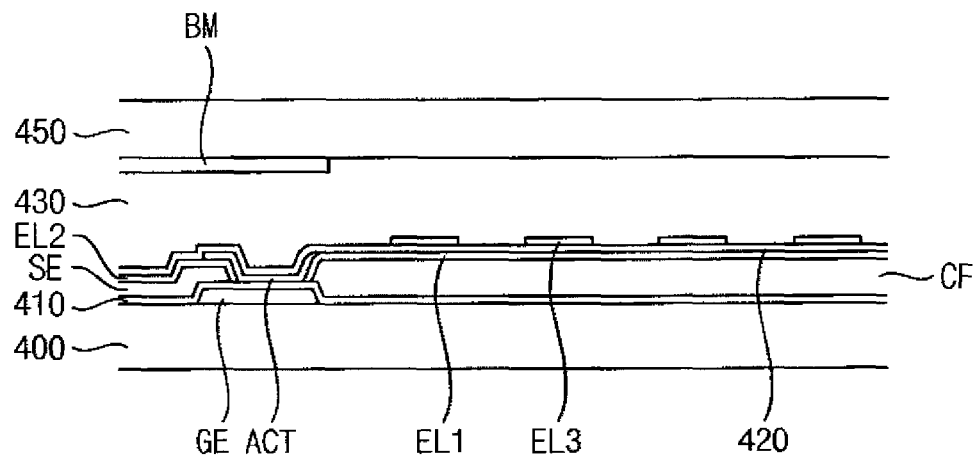
FIG. 6 is a cross-sectional view illustrating a display panel according to an example embodiment of the invention.

FIG. 6 is a cross-sectional view illustrating a display panel according to an example embodiment of the invention.

Referring to FIG. 6, the display panel includes, for example, an array substrate, an opposite substrate and a liquid crystal layer 430. The array substrate includes, for example, a first substrate 400, a gate electrode GE, a first insulating layer 410, a color filter CF, a source electrode SE, a drain electrode DE, a first electrode EL1, a second electrode EL2, a third electrode EL3 and a second insulating layer 420. The opposite substrate includes, for example, a second substrate 450 and a black matrix BM. The display panel according to the present example embodiment is substantially same as that of the display panel of FIGS. 1 to 3. Thus, only the differences between the display panel of the present example embodiment and the display panel of FIGS. 1 to 3 will be discussed and therefore any further detailed descriptions concerning the same elements will be omitted.

The first substrate 400 may be, for example, a transparent insulation substrate made of, for example, glass, plastic and/or quartz. Further, in an exemplary embodiment, the glass may include, for example, tempered glass. In an exemplary embodiment, the first substrate 400 may be formed of, for example, one of polycarbonate (PC), polyester (PET), polypropylene (PP), polyethylene (PE) and polymethyl methacrylate (PMMA). Alternatively, the first substrate 400 may instead be formed of a non-transparent material such as, for example, a silicon plate or ceramics.

The gate electrode GE is disposed on the first substrate 400. The gate electrode GE may include, for example, copper (Cu) and copper oxide (CuOx). In addition, the gate electrode GE may include, for example, gallium doped zinc oxide (GZO), indium doped zinc oxide (IZO) and/or manganese-copper alloy (CuMn). A gate line (refers to GL of FIG. 1) is disposed on the first substrate 400, and extends in, for example, a first direction (refers D1 in FIG. 1). The gate electrode GE is electrically connected to the gate line (refers to GL of FIG. 1).

The first insulating layer 410 is disposed on the gate electrode GE and electrically insulates the gate electrode GE. The first insulating layer 410 may include, for example, a transparent organic material such as an acrylic resin or benzocyclobutene (BCB) or a transparent inorganic material such as silicon oxide (SiOx), silicon nitride (SiNx), or a combination thereof.

The color filter CF is disposed on the first insulating layer 410. The color filter CF corresponds to a display area at which an image is displayed.

The source electrode SE is disposed on the first insulating layer 410. The source electrode SE partially overlaps with the gate electrode GE. The source electrode SE may include, for example, copper (Cu) and copper oxide (CuOx). In addition, the source electrode SE may include, for example, gallium doped zinc oxide (GZO), indium doped zinc oxide (IZO) and/or manganese-copper alloy (CuMn). In addition, a data line (refers to DL of FIG. 1) is disposed on the first insulating layer 410, and extends, for example, in a second direction (refers to D2 of FIG. 1) substantially perpendicular to the first direction (refers to D1 of FIG. 1). The source electrode SE is electrically connected to the data line (refers to DL of FIG. 1).

The first electrode EL1 is disposed on the color filter CF. A portion of the first electrode EL1 forms a drain electrode overlapping with the gate electrode GE. The first electrode EL1 may include, for example, a transparent conductive material, such as indium tin oxide (ITO), indium zinc oxide (IZO) and etc. In addition, the first electrode EL1 may include, for example, titanium (Ti) and/or molybdenum titanium (MoTi).

The second electrode EL2 covers the source electrode SE. The second electrode EL2 is spaced apart form the first electrode EL1. The second electrode EL2 may include, for example, a same material as the first electrode EL1. The second electrode EL2 and the first electrode EL1 may be formed, for example, from the same layer.

The active layer ACT is disposed on the first electrode EL1, the second electrode EL2 and the first insulating layer 410. The active layer ACT overlaps with the gate electrode GE, and is connected to the first electrode EL1 and the second electrode EL2.

The active layer ACT may include, for example, a semiconductor layer consisting of amorphous silicon (a-Si:H) and an ohmic contact layer consisting of n+ amorphous silicon (n+a-Si:H). In addition, the active layer ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO). In addition, the oxide semiconductor may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor.

The second insulating layer 420 is disposed on the first electrode EL1, the second electrode EL2 and the active layer ACT, and electrically insulates the first electrode EL1, the second electrode EL2 and the active layer ACT. The second insulating layer 420 may include for example, a transparent organic material such as an acrylic resin or benzocyclobutene (BCB) or a transparent inorganic material such as silicon oxide (SiOx), silicon nitride (SiNx), or a combination thereof.

The third electrode EL3 is disposed on the second insulating layer 420, and corresponds to the pixel area. The third electrode EL3 may have, for example, a silt pattern. The third electrode EL3 may include, for example, a transparent conductive material, such as indium tin oxide (ITO), indium zinc oxide (IZO) and etc. In addition, the third electrode EL3 may include, for example, titanium (Ti) and/or molybdenum titanium (MoTi).

The second substrate 450 faces the first substrate 400. The second substrate 450 may be, for example, a transparent insulation substrate made of, for example, glass, plastic and/or quartz. Further, in an exemplary embodiment, the glass may include, for example, tempered glass. In an exemplary embodiment, the second substrate 450 may be formed of, for example, one of polycarbonate (PC), polyester (PET), polypropylene (PP), polyethylene (PE) and polymethyl methacrylate (PMMA). Alternatively, the second substrate 450 may instead be formed of a non-transparent material such as, for example, a silicon plate or ceramics.

The black matrix BM is disposed under the second substrate 450. The black matrix BM overlaps with the thin film transistor, and blocks light. An over coating layer (not shown in figures) may be further disposed under the second substrate 450 to cover the black matrix BM and the second substrate 450.

The liquid crystal layer 430 is disposed between the array substrate and the opposite substrate. The liquid crystal layer 430 includes liquid crystal molecules having, for example, optical anisotropy. The liquid crystal molecules are driven by an electric field, so that an image is displayed by passing or blocking light through the liquid crystal layer 430.

Figure 7:
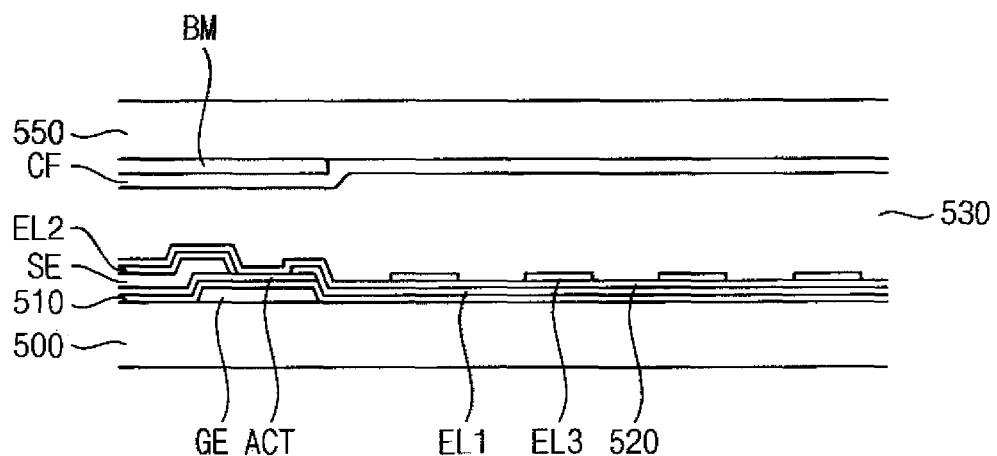
FIG. 7 is a cross-sectional view illustrating a display panel according to an example embodiment of the invention.

FIG. 7 is a cross-sectional view illustrating a display panel according to an example embodiment of the invention.

Referring to FIG. 7, the display panel includes an array substrate, an opposite substrate and a liquid crystal layer 530. The array substrate includes, for example, a first substrate 500, a gate electrode GE, a first insulating layer 510, a source electrode SE, a first electrode EL1, a second electrode EL2, a third electrode EL3 and a second insulating layer 520. The opposite substrate includes, for example, a second substrate 550, a black matrix BM and a color filter CF. The display panel according to the present example embodiment is substantially same as that of the display panel of FIGS. 1 to 3. Thus, only the differences between the display panel of the present example embodiment and the display panel of FIGS. 1 to 3 will be discussed and therefore any further detailed descriptions concerning the same elements will be omitted.

The first substrate 500 may be, for example, a transparent insulation substrate made of, for example, glass, plastic and/or quartz. Further, in an exemplary embodiment, the glass may include, for example, tempered glass. In an exemplary embodiment, the first substrate 500 may be formed of, for example, one of polycarbonate (PC), polyester (PET), polypropylene (PP), polyethylene (PE) and polymethyl methacrylate (PMMA). Alternatively, the first substrate 500 may instead be formed of a non-transparent material such as, for example, a silicon plate or ceramics.

The gate electrode GE is disposed on the first substrate 500. The gate electrode GE may include, for example, copper (Cu) and copper oxide (CuOx). In addition, the gate electrode GE may include, for example, gallium doped zinc oxide (GZO), indium doped zinc oxide (IZO) and/or manganese-copper alloy (CuMn). A gate line (refers to GL of FIG. 1) is disposed on the first substrate 300, and extends, for example, in a first direction (refers D1 in FIG. 1). The gate electrode GE is electrically connected to the gate line (refers to GL of FIG. 1).

The first insulating layer 510 is disposed on the gate electrode GE and electrically insulates the gate electrode GE. The first insulating layer 510 may include, for example, a transparent organic material such as an acrylic resin or benzocyclobutene (BCB) or a transparent inorganic material such as silicon oxide (SiOx), silicon nitride (SiNx), or a combination thereof.

The active layer ACT is disposed on the first insulating layer 510. The active layer ACT overlaps with the gate electrode GE.

The active layer ACT may include, for example, a semiconductor layer consisting of amorphous silicon (a-Si:H) and an ohmic contact layer consisting of n+ amorphous silicon (n+a-Si:H). In addition, the active layer ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaSnO). For example, the active layer ACT may include indium gallium zinc oxide (IGZO). In addition, the oxide semiconductor may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor.

The source electrode SE is disposed on the active layer ACT. The source electrode SE partially overlaps with the gate electrode GE. The source electrode SE may include, for example, copper (Cu) and copper oxide (CuOx). In addition, the source electrode SE may include, for example, gallium doped zinc oxide (GZO), indium doped zinc oxide (IZO) and/or manganese-copper alloy (CuMn). In addition, a data line (refers to DL of FIG. 1) is disposed on the first insulating layer 510, and extends, for example, in a second direction (refers to D2 of FIG. 1) substantially perpendicular to the first direction (refers to D1 of FIG. 1). The source electrode SE is electrically connected to the data line (refers to DL of FIG. 1).

The first electrode EL1 is disposed on the first insulating layer 510, and corresponds with the pixel area. The first electrode EL1 may include, for example, a transparent conductive material, such as indium tin oxide (ITO), indium zinc oxide (IZO) and etc. In addition, the first electrode EL1 may include, for example, titanium (Ti) and/or molybdenum titanium (MoTi).

A portion of the first electrode EL1 forms a drain electrode overlapping with the gate electrode GE.

The active layer ACT, the drain electrode, the gate electrode GE and the source electrode SE form a thin film transistor.

The second electrode EL2 covers the source electrode SE. The second electrode EL2 is spaced apart from the first electrode EL1. The second electrode EL2 may include, for example, a same material as the first electrode EL1. The second electrode EL2 and the first electrode EL1 may be formed, for example, from the same layer.

The source electrode SE is covered by the second electrode EL2, so that the active layer ACT may be protected form being contaminated.

The second insulating layer 520 is disposed on the first electrode EL1, the second electrode EL2 and the active layer ACT, and electrically insulates the first electrode EL1, the second electrode EL2 and the active layer ACT. The second insulating layer 520 may include for example, a transparent organic material such as an acrylic resin or benzocyclobutene (BCB) or a transparent inorganic material such as silicon oxide (SiOx), silicon nitride (SiNx), or a combination thereof.

The third electrode EL3 is disposed on the second insulating layer 520, and corresponds to the pixel area. The third electrode EL3 may have, for example, a silt pattern. The third electrode EL3 may include, for example, a transparent conductive material, such as indium tin oxide (ITO), indium zinc oxide (IZO) and etc. In addition, the third electrode EL3 may include, for example, titanium (Ti) and/or molybdenum titanium (MoTi).

The second substrate 550 faces the first substrate 500. The second substrate 550 may be, for example, a transparent insulation substrate made of, for example, glass, plastic and/or quartz. Further, in an exemplary embodiment, the glass may include, for example, tempered glass. In an exemplary embodiment, the second substrate 550 may be formed of, for example, one of polycarbonate (PC), polyester (PET), polypropylene (PP), polyethylene (PE) and polymethyl methacrylate (PMMA). Alternatively, the second substrate 550 may instead be formed of a non-transparent material such as, for example, a silicon plate or ceramics.

The black matrix BM is disposed under the second substrate 550. The black matrix BM overlaps with the thin film transistor, and blocks light.

The color filter CF is disposed under the black matrix BM and the second substrate 550.

The liquid crystal layer 530 is disposed between the array substrate and the opposite substrate. The liquid crystal layer 530 includes liquid crystal molecules having, for example, optical anisotropy. The liquid crystal molecules are driven by an electric field, so that an image is displayed by passing or blocking light through the liquid crystal layer 530.

Figure 8:
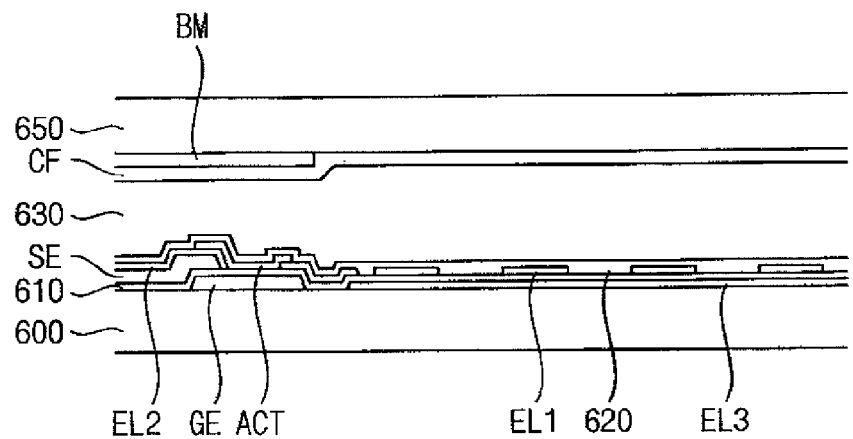
FIG. 8 is a cross-sectional view illustrating a display panel according to an example embodiment of the invention.

FIG. 8 is a cross-sectional view illustrating a display panel according to an example embodiment of the invention.

Referring to FIG. 8, the display panel includes an array substrate, an opposite substrate and a liquid crystal layer 630. The array substrate includes, for example, a first substrate 600, a gate electrode GE, a third electrode EL3, a first insulating layer 610, a source electrode SE, a drain electrode, a first electrode EL1, a second electrode EL2, and a second insulating layer 620. The opposite substrate includes, for example, a second substrate 650, a black matrix BM and a color filter CF. The display panel according to the present example embodiment is substantially same as that of the display panel of FIGS. 1 to 3. Thus, only the differences between the display panel of the present example embodiment and the display panel of FIGS. 1 to 3 will be discussed and therefore any further detailed descriptions concerning the same elements will be omitted.

The first substrate 600 may be, for example, a transparent insulation substrate made of, for example, glass, plastic, and/or quartz. Further, in an exemplary embodiment, the glass may include, for example, tempered glass. In an exemplary embodiment, the first substrate 600 may be formed of, for example, one of polycarbonate (PC), polyester (PET), polypropylene (PP), polyethylene (PE) and polymethyl methacrylate (PMMA). Alternatively, the first substrate 600 may instead be formed of a non-transparent material such as, for example, a silicon plate or ceramics.

The gate electrode GE is disposed on the first substrate 600. The gate electrode GE may include, for example, copper (Cu) and copper oxide (CuOx). In addition, the gate electrode GE may include, for example, gallium doped zinc oxide (GZO), indium doped zinc oxide (IZO) and/or manganese-copper alloy (CuMn). A gate line (refers to GL of FIG. 1) is disposed on the first substrate 600, and extends, for example, in a first direction (refers D1 in FIG. 1). The gate electrode GE is electrically connected to the gate line (refers to GL of FIG. 1).

The third electrode EL3 is disposed on the first substrate 600, corresponds to a pixel area which an image is displayed. The third electrode EL3 may include, for example, a transparent conductive material, such as indium tin oxide (ITO), indium zinc oxide (IZO) and, etc. In addition, the third electrode EL3 may include, for example, titanium (Ti) and/or molybdenum titanium (MoTi).

The first insulating layer 610 is disposed on the gate electrode GE and the third electrode EL3, and electrically insulates the gate electrode GE and the third electrode EL3. The first insulating layer 610 may include for example, a transparent organic material such as an acrylic resin or benzocyclobutene (BCB) or a transparent inorganic material such as silicon oxide (SiOx), silicon nitride (SiNx) or a combination thereof.

The source electrode SE is disposed on first insulating layer 610. The source electrode SE partially overlaps the gate electrode GE. The source electrode SE may include, for example, copper (Cu) and copper oxide (CuOx). In addition, the source electrode SE may include, for example, gallium doped zinc oxide (GZO), indium doped zinc oxide (IZO) and/or manganese-copper alloy (CuMn). In addition, a data line (refers to DL of FIG. 1) is disposed on the first insulating layer 610, and extends, for example, in a second direction (refers to D2 of FIG. 1) substantially perpendicular to the first direction (refers to D1 of FIG. 1). The source electrode SE is electrically connected to the data line (refers to DL of FIG. 1).

The first electrode EL1 is disposed on the first insulating layer 610, and corresponds with the pixel area. The first electrode EL1 may have, for example, a slit pattern. A portion of the first electrode EL1 forms a drain electrode overlapping with the gate electrode GE. The drain electrode may include, for example, a transparent conductive material, such as indium tin oxide (ITO), indium zinc oxide (IZO) and etc. In addition, the first electrode EL1 may include, for example, titanium (Ti) and/or molybdenum titanium (MoTi).

The second electrode EL2 covers the source electrode SE. The second electrode EL2 is spaced apart from the first electrode EL1. The second electrode EL2 may include, for example, a same material as the drain electrode. The second electrode EL2 and the first electrode EL1 may be formed from, for example, the same layer.

The active layer ACT is disposed on the first insulating layer 610, the second electrode EL2 and the drain electrode. The active layer ACT overlaps with the gate electrode GE. The second electrode EL2 is disposed between the source electrode SE and the active layer ACT, so that the active layer ACT may be protected form being contaminated by a material from the source electrode SE. The active layer ACT, the drain electrode, the gate electrode GE and the source electrode SE form a thin film transistor.

The active layer ACT may include, for example, a semiconductor layer consisting of amorphous silicon (a-Si:H) and an ohmic contact layer consisting of n+ amorphous silicon (n+a-Si:H). In addition, the active layer ACT may include, for example, an oxide semiconductor. The oxide semiconductor may include, for example, an amorphous oxide including at least one selected from the group consisting of indium (In), zinc (Zn), gallium (Ga), tin (Sn) and hafnium (Hf). For example, the oxide semiconductor may be consist of an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active layer ACT may include indium gallium zinc oxide (IGZO). In addition, the oxide semiconductor may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor.

The second insulating layer 620 is disposed on the first electrode EL1, the second electrode EL2 and the active layer ACT, and electrically insulates the first electrode EL1, the second electrode EL2 and the active layer ACT. The second insulating layer 620 may include for example, a transparent organic material such as an acrylic resin or benzocyclobutene (BCB) or a transparent inorganic material such as silicon oxide (SiOx), silicon nitride (SiNx), or a combination thereof.

The second substrate 650 faces to the first substrate 600. The second substrate 650 may be, for example, a transparent insulation substrate made of, for example, glass, plastic and/or quartz. Further, in an exemplary embodiment, the glass may include, for example, tempered glass. In an exemplary embodiment, the second substrate 650 may be formed of, for example, one of polycarbonate (PC), polyester (PET), polypropylene (PP), polyethylene (PE) and polymethyl methacrylate (PMMA). Alternatively, the second substrate 650 may instead be formed of a non-transparent material such as, for example, a silicon plate or ceramics.

The black matrix BM is disposed under the second substrate 650. The black matrix BM overlaps with the thin film transistor, and blocks light.

The color filter CF is disposed under the black matrix BM and the second substrate 650.

The liquid crystal layer 630 is disposed between the array substrate and the opposite substrate. The liquid crystal layer 630 includes liquid crystal molecules having, for example, optical anisotropy. The liquid crystal molecules are driven by an electric field, so that an image is displayed by passing or blocking light through the liquid crystal layer 630.

Figure 9:
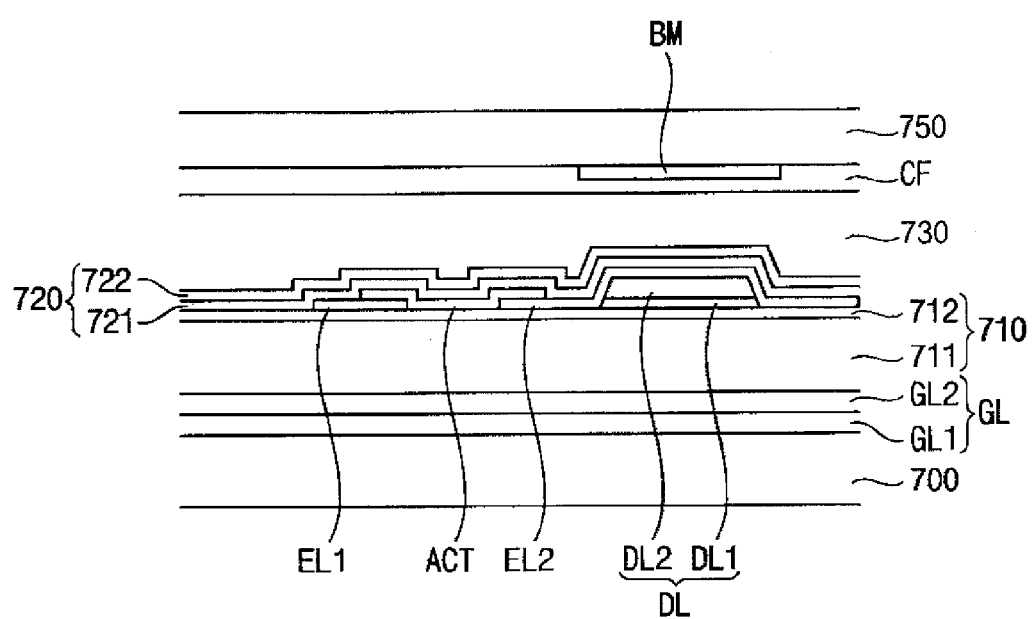
FIG. 9 is a cross-sectional view illustrating a display panel according to an example embodiment of the invention.

FIG. 9 is a cross-sectional view illustrating a display panel according to an example embodiment of the invention.

Referring to FIG. 9, the display panel is substantially same as the display panel of FIGS. 1 to 3, except that a gate line GL includes, for example, a lower gate line GL1 and an upper gate line GL2, a first insulating layer 710 includes a lower first insulating layer 711 and an upper first insulating layer 712, a data line includes an lower data line DL1 and an upper data line DL2, and a second insulating layer 720 includes, for example, a lower second insulating layer 721 and an upper second insulating layer 722. Thus, any further detailed descriptions concerning the same elements will be omitted.

The display panel includes, for example, an array substrate, an opposite substrate and a liquid crystal layer 730. The array substrate includes, for example, a first substrate 700, a gate line GL, a first insulating layer 710, a data line DL, a first electrode EL1, a second electrode EL2, an active layer ACT, a third electrode EL3 and a second insulating layer 720. The opposite substrate includes, for example, a second substrate 750, a black matrix BM and a color filter CF.

The first substrate 700 may be, for example, a transparent insulation substrate made of, for example, glass, plastic and/or quartz. Further, in an exemplary embodiment, the glass may include, for example, tempered glass. In an exemplary embodiment, the first substrate 700 may be formed of, for example, one of polycarbonate (PC), polyester (PET), polypropylene (PP), polyethylene (PE) and polymethyl methacrylate (PMMA). Alternatively, the first substrate 700 may instead be formed of a non-transparent material such as, for example, a silicon plate or ceramics.

The gate line GL is disposed on the first substrate 700. The gate line GL includes, for example, the lower gate line GL1 and the upper gate line GL2. The lower gate line GL1 may include, for example, gallium doped zinc oxide (GZO) and/or indium doped zinc oxide (IZO). Thickness of the lower gate line GL1 may be, for example, about 300 Å. The upper gate line GL2 may include, for example, copper (Cu). Thickness of the upper gate line GL2 may be, for example, about 3000 Å.

The first insulating layer 710 is disposed on the gate line GL, and electrically insulates the gate line GL. The first insulating layer 710 includes, for example, the lower first insulating layer 711 and the upper first insulating layer 712. The lower first insulating layer 711 may include, for example, silicon nitride (SiNx). Thickness of the lower first insulating layer 711 may be, for example, about 4000 Å. The upper first insulating layer 712 may include, for example, silicon oxide (SiOx). Thickness of the upper first insulating layer 712 may be, for example, about 400 Å. Alternatively, in an embodiment, the lower first insulating layer 711 and upper first insulating layer 712 may also be formed of other materials such as, for example, an acrylic resin or benzocyclobutene (BCB).

The data line DL disposed on the first insulating layer 710. The data line DL includes, for example, the lower data line DL1 and the upper data line DL2. The lower data line DL1 may include, for example, gallium doped zinc oxide (GZO) and/or indium doped zinc oxide (IZO). Thickness of the lower data line DL1 may be, for example, about 300 Å. The upper data line DL2 may include, for example, copper (Cu). Thickness of the upper data line DL2 may be, for example, about 3000 Å.

The first electrode EL1 is disposed on the first insulating layer 710, and corresponds with the pixel area. The first electrode EL1 may include, for example, indium tin oxide (ITO) and/or indium zinc oxide (IZO). Thickness of the first electrode EL1 may be, for example, about 450 Å.

The second electrode EL2 covers the data line DL. The second electrode EL2 is spaced apart from the first electrode EL1. The second electrode EL2 may include a same material as the first electrode EL1. The second electrode EL2 and the first electrode EL1 may be formed from, for example, the same layer. Thickness of the second electrode EL2 may be, for example, about 450 Å.

The active layer ACT is disposed on the first insulating layer 710, and connects the first electrode EL1 and the second electrode EL2. The active layer ACT, a gate electrode which is a portion of the gate line GL, a source electrode which is a portion of the second electrode EL2, and a drain electrode which is a portion of the first electrode EL1 form a thin film transistor.

The active layer ACT may include, for example, indium gallium zinc oxide (IGZO). Thickness of the active layer ACT may be, for example, about 400 Å to about 500 Å.

The active layer ACT is electrically connected to the data line DL through the second electrode EL2. Although the active layer ACT includes, for example, the oxide semiconductor and the data line DL includes copper, the active layer ACT may be protected form being contaminated by a material from the data line DL.

The second insulating layer 720 is disposed on the first electrode ELL the second electrode EL2 and the active layer ACT. The second insulating layer 720 electrically insulates the first electrode EL1, the second electrode EL2 and the active layer ACT. The second insulating layer 720 includes, for example, the lower second insulating layer 721 and the upper second insulating layer 722. The lower second insulating layer 721 may include, for example, silicon oxide (SiOx). Thickness of the lower second insulating layer 721 may be, for example, about 1000 Å. The upper second insulating layer 722 may include, for example, silicon nitride (SiNx). Thickness of the upper second insulating layer 722 may be, for example, about 1000 Å. Alternatively, in an embodiment, the lower second insulating layer 721 and upper second insulating layer 722 may each also be formed of other materials such as, for example, an acrylic resin or benzocyclobutene (BCB).

The third electrode (refers to EL3 of FIG. 3) is disposed on the second insulating layer 720, and corresponds to the pixel area. The third electrode (refers to EL3 of FIG. 3) may have, for example, a silt pattern. The third electrode EL3 may include, for example, a transparent conductive material, such as indium tin oxide (ITO), indium zinc oxide (IZO) and etc. In addition, the third electrode EL3 may include, for example, titanium (Ti) and/or molybdenum titanium (MoTi).

The second substrate 750 faces the first substrate 700. The second substrate 750 may be, for example, a transparent insulation substrate made of, for example, glass, plastic and/or quartz. Further, in an exemplary embodiment, the glass may include, for example, tempered glass. In an exemplary embodiment, the second substrate 750 may be formed of, for example, one of polycarbonate (PC), polyester (PET), polypropylene (PP), polyethylene (PE) and polymethyl methacrylate (PMMA). Alternatively, the second substrate 750 may instead be formed of a non-transparent material such as, for example, a silicon plate or ceramics.

The black matrix BM is disposed under the second substrate 750. The black matrix BM overlaps with the thin film transistor, and blocks light.

The color filter CF is disposed under the black matrix BM and the second substrate 750.

The liquid crystal layer 730 is disposed between the array substrate and the opposite substrate. The liquid crystal layer 730 includes liquid crystal molecules having, for example, optical anisotropy. The liquid crystal molecules are driven by an electric field, so that an image is displayed by passing or blocking light through the liquid crystal layer 730.

In the present example embodiment, the second electrode EL2 covers a side of the lower data line DL 1 and a side of the upper data line DL2. Thus, a void caused by different etch rates of the lower data line DL and the upper data line DL2 during patterning process may be reduced, because the second electrode EL2 covers the sides of the lower data line DL and the upper data line DL2. Therefore, the second insulating layer 720 may be uniformly formed.

FIGS. 10A to 10E are cross-sectional views explaining a method of manufacturing an array substrate of the display panel of FIG. 1.

Figure 10A:
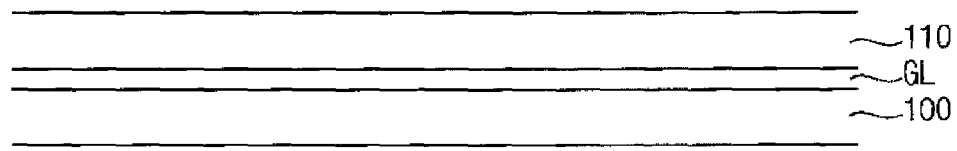
FIGS. 10A to 10E are cross-sectional views explaining a method of manufacturing the array substrate of the display panel of FIG. 1.

Referring to FIG. 10A, a gate line GL is formed on a first substrate 100. The gate line GL may be formed, for example, by patterning a metal layer using a first mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

A first insulating layer 110 is formed on the gate line GL. The first insulating layer 110 may be formed by, for example, transparent organic material such as acrylic resin or benzocyclobutene (BCB) or transparent inorganic material such as silicon oxide (SiOx), silicon nitride (SiNx) or a combination thereof. The first insulating layer 110 may be formed by, for example, a plasma chemical vapor deposition or an organic film coating process. In addition, the first insulating layer 110 may be formed as, for example, a double layer structure having layers formed of different materials and by different processes than each other.

Figure 10B:
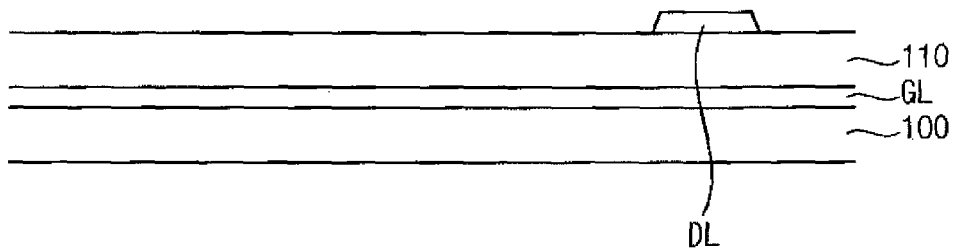

Referring to FIG. 10B, a data line DL is formed on the first insulating layer 110. The data line DL may be formed by, for example, patterning a metal layer on the first insulating layer 110 using a second mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

Figure 10C:
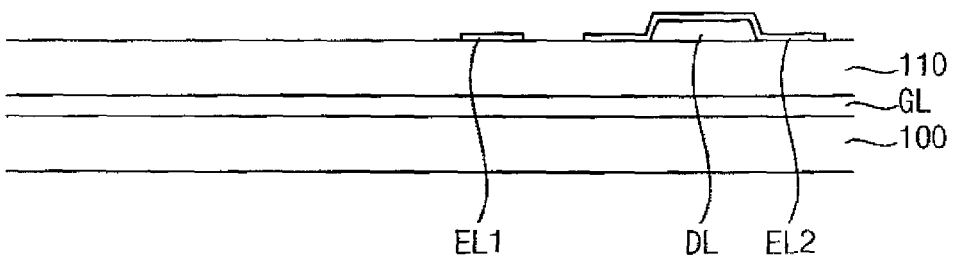

Referring to FIG. 10C, a first electrode EL1 and a second electrode EL2 are formed on the first insulating layer 110. A transparent conductive layer is formed on the first insulating layer 110. The first electrode EL1 and the second electrode EL2 are formed by, for example, patterning the transparent conductive layer using a third mask. The transparent conductive layer may include, for example, transparent conductive material, such as indium tin oxide (ITO), indium zinc oxide (IZO) and etc. The second electrode EL2 covers the data line DL.

Figure 10D:
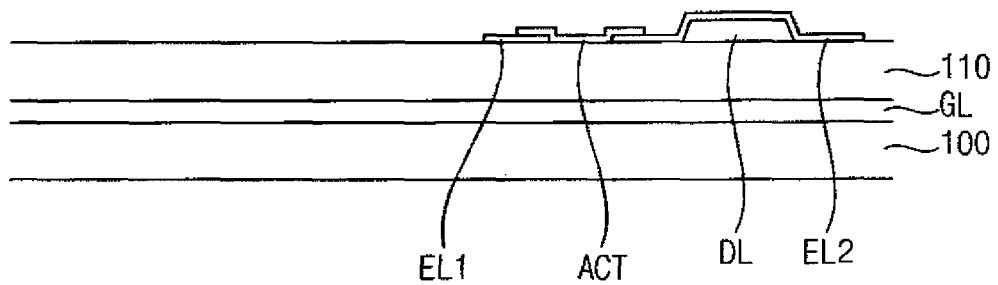

Referring to FIG. 10D, an active layer ACT connecting the first electrode EL1 to a second electrode EL2 is formed on the first insulating layer 110. An oxide semiconductive layer is formed on the first insulating layer 110 by, for example, a sputtering process. The active layer ACT is formed by, for example, patterning the oxide semiconductive layer using a fourth mask. The oxide semiconductive layer may include, for example, an amorphous oxide having at least one or more of indium (In), zinc (Zn), gallium (Ga), tin (Sn) and hafnium (Hf). For example, the oxide semiconductive layer may include an amorphous oxide having indium (In), zinc (Zn) and gallium (Ga), or amorphous oxide having indium (In), zinc (Zn) and hafnium (Hf). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GiZnO). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). For example, the oxide semiconductive layer may include indium gallium zinc oxide (IGZO). In addition, the oxide semiconductor layer may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor layer.

Figure 10E:
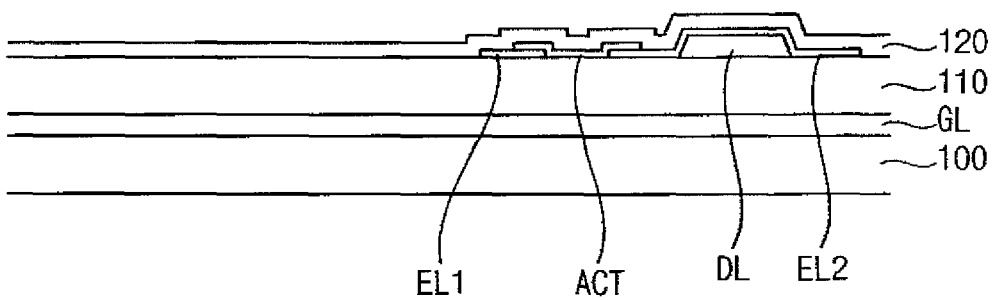

Referring FIG. 10E, a second insulating layer 120 is formed on the first electrode EL1, the active layer ACT and the second electrode EL2. The second insulating layer 120 may be formed by using, for example, a transparent organic material such as an acrylic resin or benzocyclobutene (BCB) or a transparent inorganic material such as silicon oxide (SiOx), silicon nitride (SiNx) or a combination thereof. The second insulating layer 120 may be formed by, for example, a plasma chemical vapor deposition or an organic film coating process. In addition, the second insulating layer 120 may be formed, for example, as a double layer structure having layers formed of different materials and by different processes than each other.

FIGS. 11A to 11F are cross-sectional views explaining a method of manufacturing an array substrate of the display panel of FIG. 4.

Figure 11A:
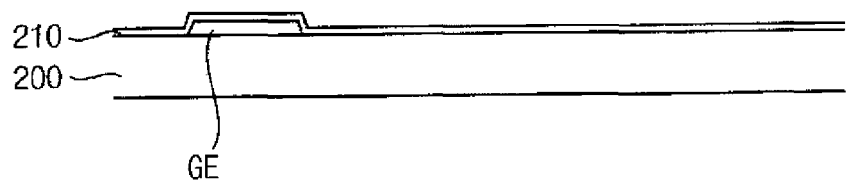
FIGS. 11A to 11F are cross-sectional views explaining a method of manufacturing the array substrate of the display panel of FIG. 4.

Referring to FIG. 11A, a gate electrode GE and a gate line (refers GL of FIG. 1) are formed on a first substrate 200. The gate electrode GE and the gate line (refers GL of FIG. 1) are formed by, for example, patterning a metal layer on the first substrate 200 using a first mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

A first insulating layer 210 is formed on the gate electrode GE and the gate line (refers GL of FIG. 1). The first insulating layer 210 may be formed by, for example, using a transparent organic material such as an acrylic resin or benzocyclobutene (BCB) or a transparent inorganic material such as silicon oxide (SiOx), silicon nitride (SiNx) or a combination thereof. The first insulating layer 210 may be formed by, for example, a plasma chemical vapor deposition or an organic film coating process. In addition, the first insulating layer 210 may be formed as, for example, a double layer structure having layers formed of different materials and by different processes than each other.

Figure 11B:
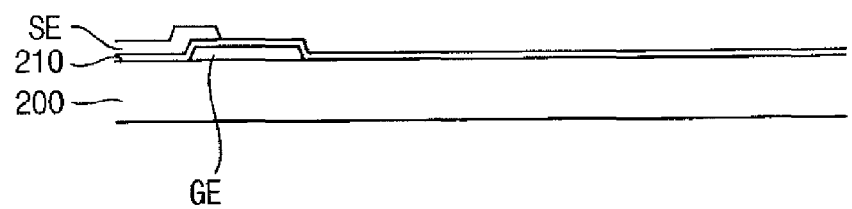

Referring to FIG. 11B, a source electrode SE and a data line (refers DL of FIG. 1) are formed on the first insulating layer 210. A metal layer is formed on the first insulating layer 210. The source electrode SE and the data line (refers DL of FIG. 1) are formed by, for example, patterning the metal layer using a second mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

Figure 11C:
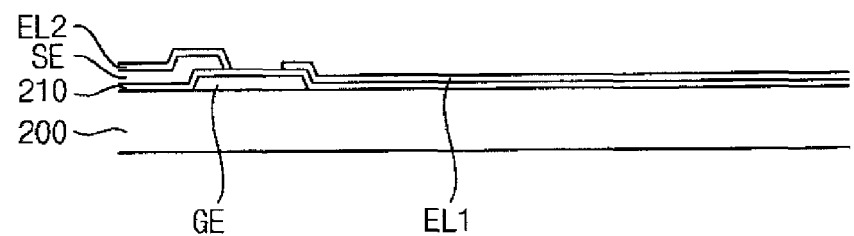

Referring to FIG. 11C, a first electrode EL1 and a second electrode EL2 are formed on the first insulating layer 210, the source electrode SE and the data line (refers DL of FIG. 1). A transparent conductive layer is formed on the first insulating layer 210. The first electrode EL1 and the second electrode EL2 are formed by, for example, patterning the transparent conductive layer using a third mask. The transparent conductive layer may include, for example, transparent conductive material, such as indium tin oxide (ITO), indium zinc oxide (IZO) and etc. The second electrode EL2 covers the source electrode SE.

Figure 11D:
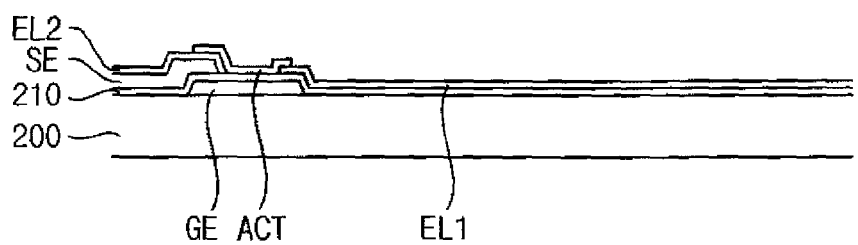

Referring to FIG. 11D, an active layer ACT connecting the first electrode EL1 to a second electrode EL2 is formed on the first insulating layer 210. An oxide semiconductive layer is formed on the first insulating layer 210 by, for example, a sputtering process. The active layer ACT is formed by, for example, patterning the oxide semiconductive layer using a fourth mask. The oxide semiconductive layer may include, for example, an amorphous oxide having at least one or more of indium (In), zinc (Zn), gallium (Ga), tin (Sn) and hafnium (Hf). For example, the oxide semiconductive layer may include amorphous oxide having indium (In), zinc (Zn) and gallium (Ga), or amorphous oxide having indium (In), zinc (Zn) and hafnium (Hf). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaSnO). For example, an oxide semiconductive layer may include indium gallium zinc oxide (IGZO). In addition, the oxide semiconductor layer may also be formed of other materials which include, for example, an oxide semiconductor layer doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor layer.

Figure 11E:
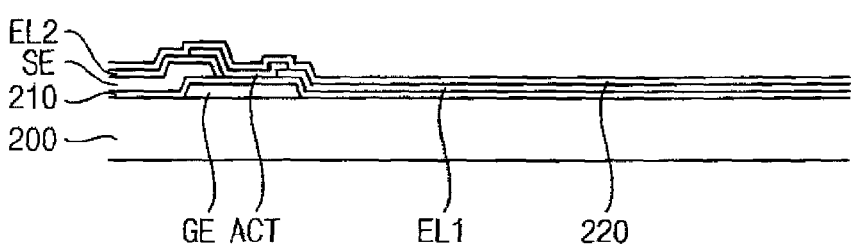

Referring to FIG. 11E, a second insulating layer 220 is formed on the first electrode EL1, the active layer ACT and the second electrode EL2. The second insulating layer 220 may be formed by, for example, using a transparent organic material such as acrylic resin or benzocyclobutene (BCB) or a transparent inorganic material such as silicon oxide (SiOx), silicon nitride (SiNx) or a combination thereof. The second insulating layer 220 may be formed by, for example, a plasma chemical vapor deposition or an organic film coating process. In addition, the second insulating layer 220 may be formed as, for example, a double layer structure having layers formed of different materials and by different processes than each other.

Figure 11F:
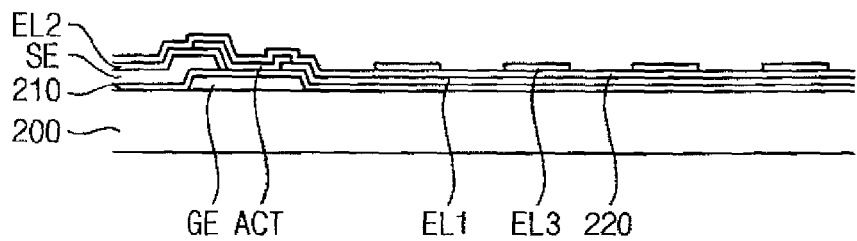

Referring to FIG. 11F, a third electrode EL3 is formed on the second insulating layer 220. A transparent conductive layer is formed on the second insulating layer 220. The third electrode EL3 is formed by, for example, patterning the transparent conductive layer using a fifth mask. The transparent conductive layer may include, for example, transparent conductive material, such as indium tin oxide (ITO), indium zinc oxide (IZO) and etc. The third electrode EL3 may have, for example, a slit pattern.

FIGS. 12A to 12E are cross-sectional views explaining a method of manufacturing an array substrate of the display panel of FIG. 5.

Figure 12A:
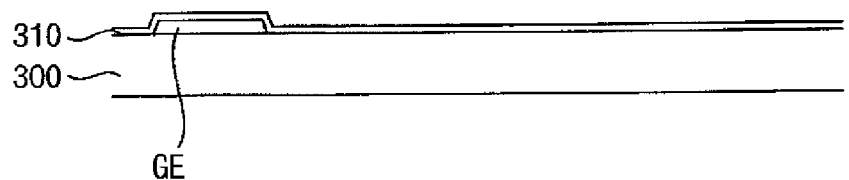
FIGS. 12A to 12E are cross-sectional views explaining a method of manufacturing the array substrate of the display panel of FIG. 5.

Referring to FIG. 12A, a gate electrode GE and a gate line (refers to GL of FIG. 1) are formed on a first substrate 300. The gate electrode GE and the gate line (refers to GL of FIG. 1) are formed by, for example, patterning a metal layer on the first substrate 300 using a first mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

A first insulating layer 310 is formed on the gate electrode GE and the gate line (refers to GL of FIG. 1). The first insulating layer 310 may be formed, for example, using a transparent organic material such as an acrylic resin or benzocyclobutene (BCB) or a transparent inorganic material such as silicon oxide (SiOx) silicon nitride (SiNx) or a combination thereof. The first insulating layer 310 may be formed by, for example, a plasma chemical vapor deposition or an organic film coating process. In addition, the first insulating layer 310 may be formed as, for example, a double layer structure having layers formed of different materials and by different processes than each other.

Figure 12B:
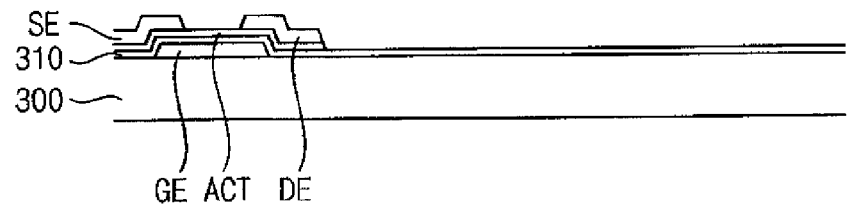

Referring to FIG. 12B, an active layer ACT overlapping with the gate electrode GE is formed on the first insulating layer 310. A source electrode SE and a drain electrode DE are formed on the active layer ACT.

An oxide semiconductive layer is formed on the first insulating layer 310 by, for example, a sputtering process. A metal layer is formed on the oxide semiconductive layer. The active layer ACT, the source electrode SE and the drain electrode DE are formed by, for example, patterning the oxide semiconductive layer and the metal layer using a second mask. A Boundary of the active layer ACT may partially coincide with a boundary of the source and drain electrodes SE and DE. Thus, the active layer ACT, the source electrode SE and the drain electrode DE may be formed by, for example, using one mask having a double structure such as a mask having a slit.

The oxide semiconductive layer may include, for example, an amorphous oxide having at least one or more of indium (In), zinc (Zn), gallium (Ga), tin (Sn) and hafnium (Hf). For example, the oxide semiconductive layer may include an amorphous oxide having indium (In), zinc (Zn) and gallium (Ga), or amorphous oxide having indium (In), zinc (Zn) and hafnium (Hf). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). The oxide semiconductive layer may include an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). For example, the oxide semiconductive layer may include indium gallium zinc oxide (IGZO). In addition, the oxide semiconductor layer may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor layer.

The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

Figure 12C:
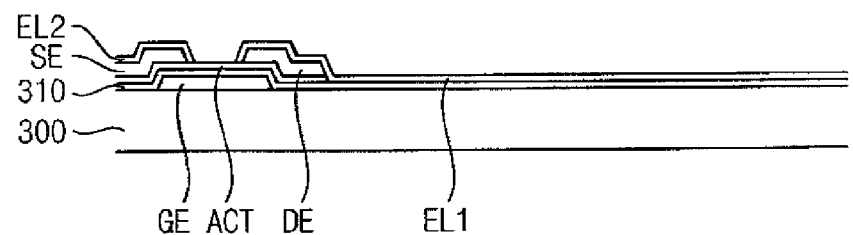

Referring to FIG. 12C, a first electrode EL1 is formed on the first insulating layer 310 and the drain electrode DE. A second electrode EL2 is formed on the source electrode SE. A transparent conductive layer is formed on the first insulating layer 310. The first electrode EL1 and the second electrode EL2 are formed by, for example, patterning the transparent conductive layer using a third mask. The transparent conductive layer may include, for example, transparent conductive material, such as indium tin oxide (ITO), indium zinc oxide (IZO) and etc. The second electrode EL2 covers the source electrode SE. The first electrode EL1 covers the drain electrode DE.

Figure 12D:
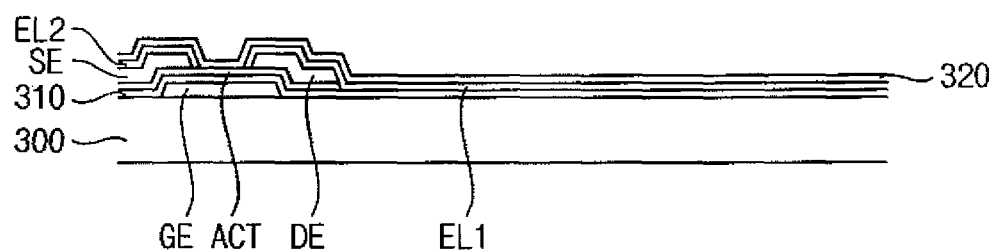

Referring to FIG. 12D, a second insulating layer 320 is formed on the first electrode EL1, the active layer ACT and the second electrode EL2. The second insulating layer 320 may be formed, for example, by using a transparent organic material such as an acrylic resin or benzocyclobutene (BCB) or a transparent inorganic material such as silicon oxide (SiOx), silicon nitride (SiNx) or a combination thereof. The second insulating layer 320 may be formed by, for example, a plasma chemical vapor deposition or an organic film coating process. In addition, the second insulating layer 320 may be formed, for example, as a double layer structure having layers formed of different materials and by different processes than each other.

Figure 12E:
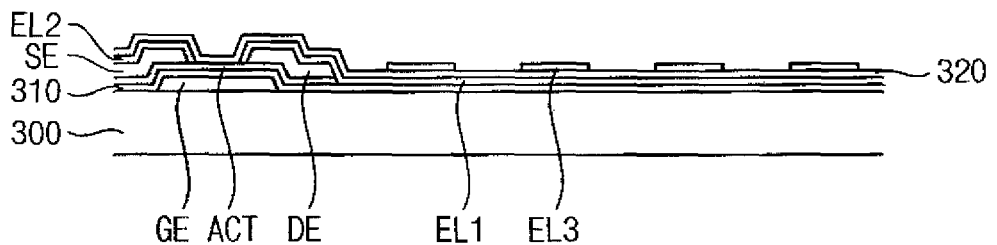

Referring to FIG. 12E, a third electrode EL3 is formed on the second insulating layer 320. A transparent conductive layer is formed on the second insulating layer 320. The third electrode EL3 is formed by, for example, patterning the transparent conductive layer using a fourth mask. The transparent conductive layer may include, for example, a transparent conductive material, such as indium tin oxide (ITO), indium zinc oxide (IZO) and etc. The third electrode EL3 may have, for example, a slit pattern.

FIGS. 13A to 13G are cross-sectional views explaining a method of manufacturing an array substrate of the display panel of FIG. 6.

Figure 13A:
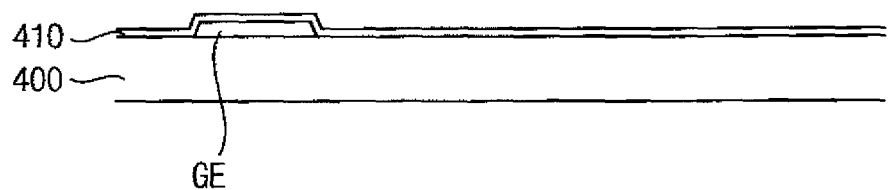
FIGS. 13A to 13G are cross-sectional views explaining a method of manufacturing the array substrate of the display panel of FIG. 6.

Referring to FIG. 13A, a gate electrode GE and a gate line (refers GL of FIG. 1) are formed on a first substrate 400. The gate electrode GE and the gate line (refers GL of FIG. 1) are formed by, for example, pattering a patterning a metal layer on the first substrate 400 using a first mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

A first insulating layer 410 is formed on the gate electrode GE and the gate line (refers GL of FIG. 1). The first insulating layer 410 may be formed, for example, by using a transparent organic material such as an acrylic resin or benzocyclobutene (BCB) or a transparent inorganic material such as silicon oxide (SiOx), silicon nitride (SiNx) or a combination thereof. The first insulating layer 410 may be formed by, for example, a plasma chemical vapor deposition or an organic film coating process. In addition, the first insulating layer 410 may be formed as, for example, a double layer structure having layers formed of different materials and by different processes than each other.

Figure 13B:
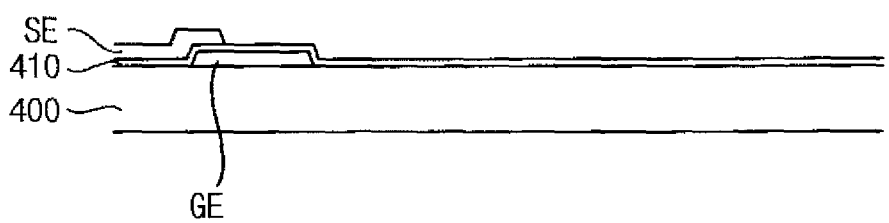

Referring to FIG. 13B, a source electrode SE and a data line (refers to DL of FIG. 1) are formed on the first insulating layer 410. A metal layer is formed on the first insulating layer 410. The source electrode SE and the data line (refers to DL of FIG. 1) are formed by, for example, patterning the metal layer using a second mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

Figure 13C:
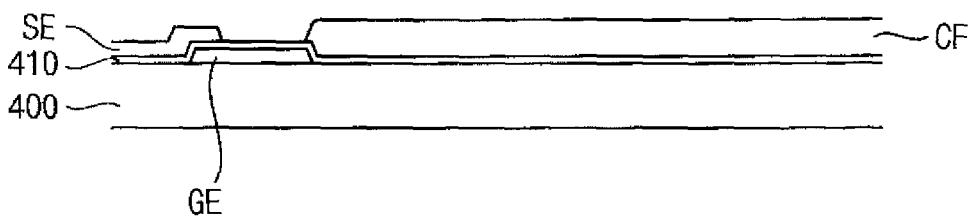

Referring to FIG. 13C, a color filter CF is framed on the first insulating layer 410. The color filter CF corresponds to a pixel area. Although the color filter CF is formed on the first insulating layer 410 in the present example embodiment, other kinds of organic layers may be further formed as occasion demands. For example, a black matrix blocking light may be formed.

Figure 13D:
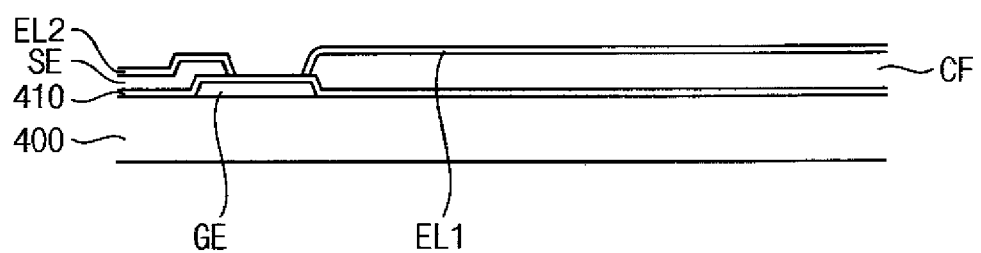

Referring to FIG. 13D, a first electrode EL1 is formed on the color filter CF. A second electrode EL2 is formed on the source electrode SE and the data line (refers DL of FIG. 1). A transparent conductive layer is formed on the color filter CF. The first electrode EL1 and the second electrode EL2 are formed by, for example, patterning the transparent conductive layer using a third mask. The transparent conductive layer may include, for example, transparent conductive material, such as indium tin oxide (ITO), indium zinc oxide (IZO) and etc. The second electrode EL2 covers the source electrode SE.

Figure 13E:
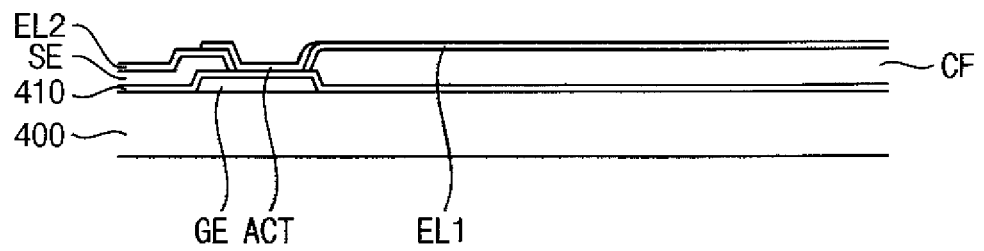

Referring to FIG. 13E, an active layer ACT connecting the first electrode ED to a second electrode EL2 is formed on the first insulating layer 410. An oxide semiconductive layer is formed on the first insulating layer 410 by, for example, a sputtering process. The active layer ACT is formed by, for example, patterning the oxide semiconductive layer using a fourth mask. The oxide semiconductive layer may include, for example, an amorphous oxide having at least one or more of indium (In), zinc (Zn), gallium (Ga), tin (Sn) and hafnium (Hf). For example, the oxide semiconductive layer may include an amorphous oxide having indium (In), zinc (Zn) and gallium (Ga), or amorphous oxide having indium (In), zinc (Zn) and hafnium (Hf). The oxide semiconductive layer may include, for example, an oxide such as indium zinc oxide (InZnO), indium gallium oxide (InGaD), indium tin oxide (InSnO), tin zinc oxide (ZnSnO), tin gallium oxide (GaSnO) and tin gallium oxide (GaSnO). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). For example, the oxide semiconductive layer may include indium gallium zinc oxide (IGZO). In addition, the oxide semiconductor layer may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor layer.

Figure 13F:
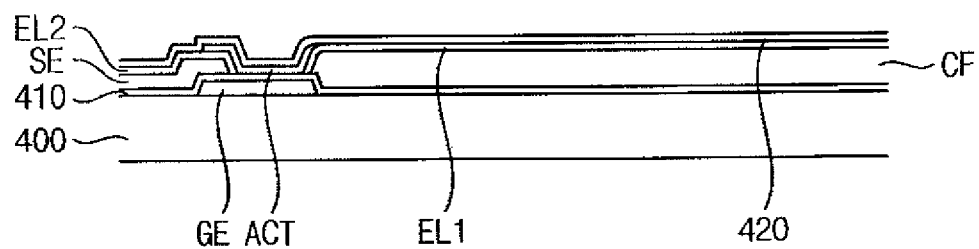

Referring to FIG. 13F, a second insulating layer 420 is formed on the first electrode EL1, the active layer ACT and the second electrode EL2. The second insulating layer 420 may be formed, for example, by using a transparent organic material such as acrylic resin or benzocyclobutene (BCB) or a transparent inorganic material such as silicon oxide (SiOx), silicon nitride (SiNx) or a combination thereof. The second insulating layer 420 may be formed by, for example, a plasma chemical vapor deposition or an organic film coating process. In addition, the second insulating layer 420 may be formed, for example, as a double layer structure having layers formed of different materials and by different processes than each other.

Figure 13G:
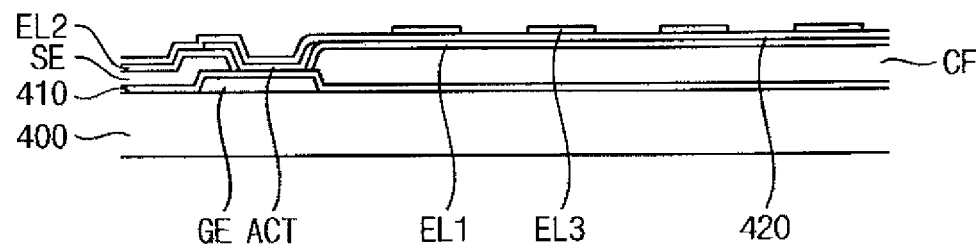

Referring to FIG. 13G a third electrode EL3 is formed on the second insulating layer 420. A transparent conductive layer is formed on the second insulating layer 420. The third electrode EL3 is formed by, for example, patterning the transparent conductive layer using a fifth mask. The transparent conductive layer may include, for example, transparent conductive material, such as indium tin oxide (ITO), indium zinc oxide (IZO) and etc. The third electrode EL3 may have, for example, a slit pattern.

FIGS. 14A to 14E are cross-sectional views explaining a method of manufacturing an array substrate of the display panel of FIG. 7.

Figure 14A:
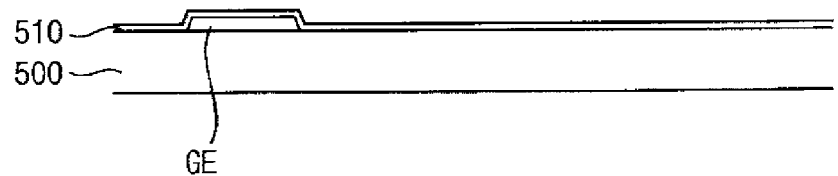
FIGS. 14A to 14E are cross-sectional views explaining a method of manufacturing the array substrate of the display panel of FIG. 7.

Referring to FIG. 14A, a gate electrode GE and a gate line (refers to GL of FIG. 1) are formed on a first substrate 500. The gate electrode GE and the gate line (refers to GL of FIG. 1) are formed by, for example, patterning a metal layer on the first substrate 500 using a first mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

A first insulating layer 510 is formed on the gate electrode GE and the gate line (refers to GL of FIG. 1). The first insulating layer 510 may be formed, for example, by using a transparent organic material such as an acrylic resin or benzocyclobutene (BCB) or a transparent inorganic material such as silicon oxide (SiOx), silicon nitride (SiNx) or a combination thereof. The first insulating layer 510 may be formed by, for example, a plasma chemical vapor deposition or an organic film coating process. In addition, the first insulating layer 510 may be formed as, for example, a double layer structure having layers formed of different materials and by different processes than each other.

Figure 14B:
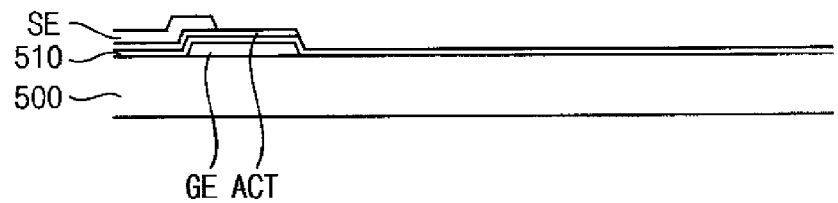

Referring to FIG. 14B, an active layer ACT overlapping with the gate electrode GE is formed on the first insulating layer 510. A source electrode SE is formed on the active layer ACT.

An oxide semiconductive layer is formed on the first insulating layer 510 by, for example, a sputtering process. A metal layer is formed on the oxide semiconductive layer. The active layer ACT, the source electrode SE and the drain electrode DE are formed by, for example, patterning the oxide semiconductive layer and the metal layer using a second mask. A boundary of the active layer ACT may partially coincide with a boundary of the source and drain electrodes SE and DE. Thus, the active layer ACT, the source electrode SE and the drain electrode DE may be formed by using, for example, one mask having a double structure such as a mask having a slit.

The oxide semiconductive layer may include, for example, an amorphous oxide having at least one or more of indium (In), zinc (Zn), gallium (Ga), tin (Sn) and hafnium (Hf). For example, the oxide semiconductive layer may include an amorphous oxide having indium (In), zinc (Zn) and gallium (Ga), or amorphous oxide having indium (In), zinc (Zn) and hafnium (Hf). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). For example, the oxide semi-conductive layer may include indium gallium zinc oxide (IGZO). In addition, the oxide semiconductor layer may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor layer.

The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

Figure 14C:
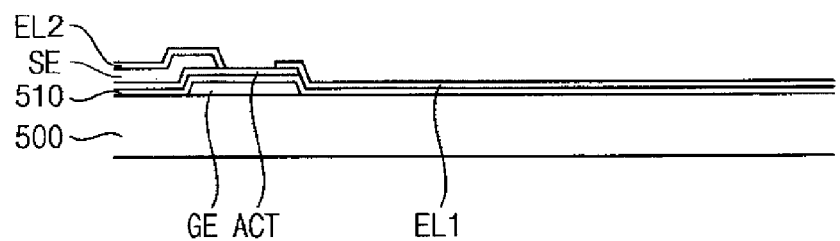

Referring to FIG. 14C, a first electrode EL1 is formed on the first insulating layer 510 and a portion of the active layer ACT. A second electrode EL2 is formed on the source electrode SE. A transparent conductive layer is formed on the first insulating layer 510. The first electrode EL1 and the second electrode EL2 are formed by, for example, patterning the transparent conductive layer using a third mask. The transparent conductive layer may include, for example, a transparent conductive material, such as indium tin oxide (ITO), indium zinc oxide (IZO) and etc. The second electrode EL2 covers the source electrode SE.

Figure 14D:
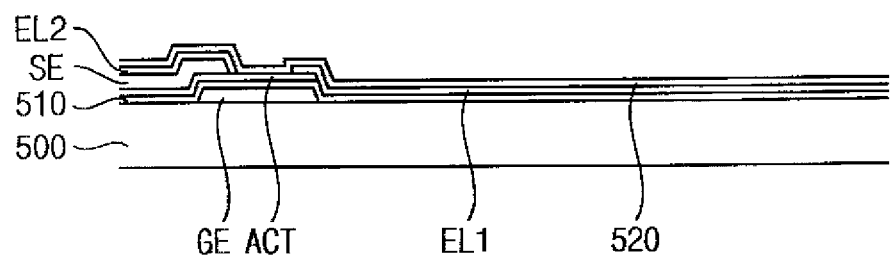

Referring to FIG. 14D, a second insulating layer 520 is formed on the first electrode EL1, the active layer ACT and the second electrode EL2. The second insulating layer 520 may be formed, for example, by using a transparent organic material such as an acrylic resin or benzocyclobutene (BCB) or a transparent inorganic material such as silicon oxide (SiOx), silicon nitride (SiNx) or a combination thereof. The second insulating layer 520 may be formed by, for example, a plasma chemical vapor deposition or an organic film coating process. In addition, the second insulating layer 520 may be formed as, for example, a double layer structure having layers formed of different materials and by different processes than each other.

Figure 14E:
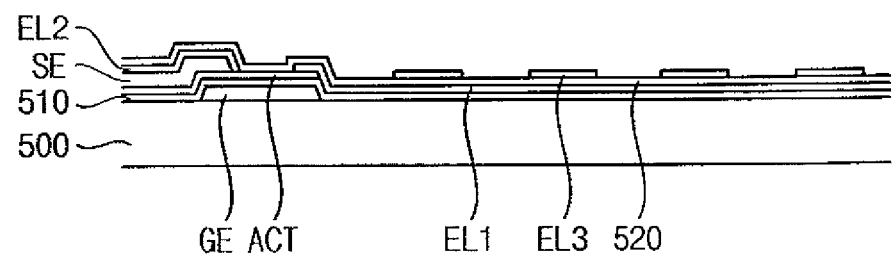

Referring to FIG. 14E, a third electrode EL3 is formed on the second insulating layer 520. A transparent conductive layer is formed on the second insulating layer 520. The third electrode EL3 is formed by, for example, patterning the transparent conductive layer using a fourth mask. The transparent conductive layer may include, for example, a transparent conductive material, such as indium tin oxide (ITO), indium zinc oxide (IZO) and etc. The third electrode EL3 may have, for example, a slit pattern.

FIGS. 15A to 15E are cross-sectional views explaining a method of manufacturing an array substrate of the display panel of FIG. 8.

Figure 15A:
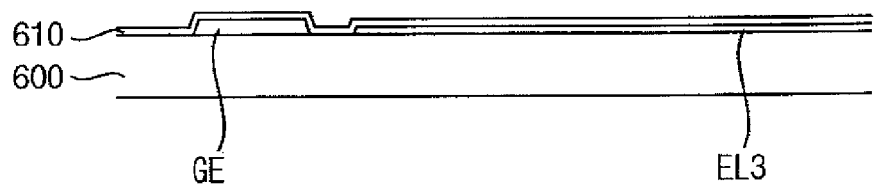
FIGS. 15A to 15E are cross-sectional views explaining a method of manufacturing an array substrate of the display panel of FIG. 8.

Referring to FIG. 15A, a gate electrode GE and a gate line (refers to GL of FIG. 1) are formed on a first substrate 600. A third electrode EL3 is formed on the first substrate 600.

The gate electrode GE and the gate line (refers to GL of FIG. 1) are formed by, for example, patterning a metal layer on the first substrate 600 using a first mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

A transparent conductive layer is formed on the first substrate 600. The third electrode EL3 is formed by, for example, patterning the transparent conductive layer using a second mask. The transparent conductive layer may include, for example, a transparent conductive material, such as indium tin oxide (ITO), indium zinc oxide (IZO) and etc. The third electrode EL3 may have, for example, a slit pattern.

In addition, all of the gate electrode GE, the gate line (refers GL of FIG. 1) and the third electrode EL3 may include, for example, transparent conductive materials, and may be formed by patterning using one mask.

A first insulating layer 610 is formed on the third electrode EL3, the gate electrode GE and the gate line (refers GL of FIG. 1). The first insulating layer 610 may be formed, for example, by using a transparent organic material such as an acrylic resin or benzocyclobutene (BCB) or a transparent inorganic material such as silicon oxide (SiOx), silicon nitride (SiNx) or a combination thereof. The first insulating layer 610 may be formed by, for example, a plasma chemical vapor deposition or an organic film coating process. In addition, the first insulating layer 610 may be formed, for example, as a double layer structure having layers formed of different materials and by different processes than each other.

Figure 15B:
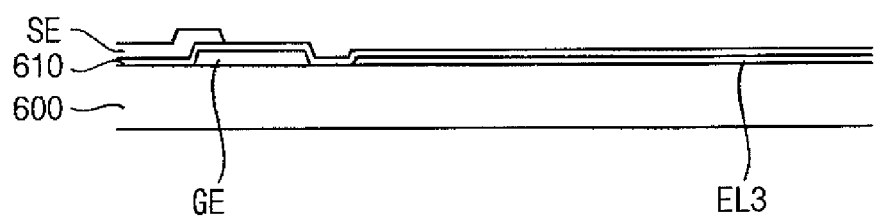

Referring to FIG. 15B, a source electrode SE and a data line (refers to DL of FIG. 1) are formed on the first insulating layer 610. A metal layer is formed on the first insulating layer 610. The source electrode SE and the data line (refers to DL of FIG. 1) are formed by, for example, patterning the metal layer using a third mask. The metal layer may include, for example, copper (Cu) and copper oxide (CuOx). In addition, the metal layer may include, for example, gallium doped zinc oxide (GZO), indium doped zinc oxide (IZO) and/or manganese-copper alloy (CuMn).

Figure 15C:
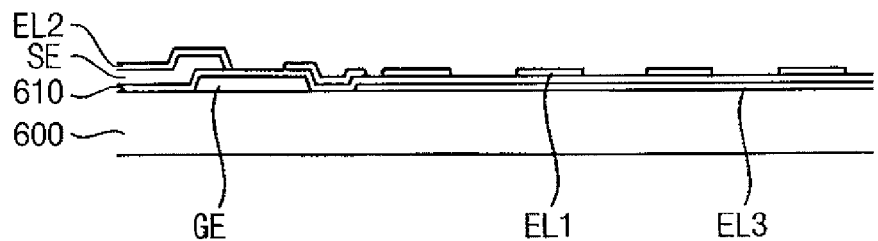

Referring to FIG. 15C, a first electrode EL1 is formed on the first insulating layer 610. A second electrode EL2 is formed on the source electrode SE and the data line (refers to DL of FIG. 1. A transparent conductive layer is formed on the first insulating layer 610. The first electrode EL1 and the second electrode EL2 are formed by, for example, patterning the transparent conductive layer using a fourth mask. The transparent conductive layer may include, for example, a transparent conductive material, such as indium tin oxide (ITO), indium zinc oxide (IZO) and etc. The second electrode EL2 covers the source electrode SE. The first electrode ED covers the drain electrode DE.

Figure 15D:
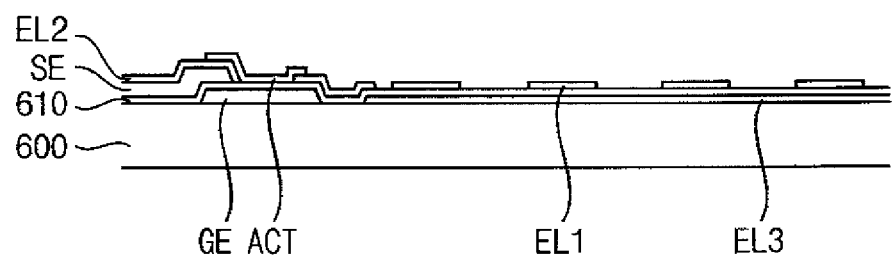

Referring to FIG. 15D, an active layer ACT connecting the first electrode EL1 to a second electrode EL2 is formed on the first insulating layer 610. An oxide semiconductive layer is formed on the first insulating layer 610 by a sputtering process. The active layer ACT is formed by, for example, patterning the oxide semiconductive layer using a fifth mask. The oxide semiconductive layer may include, for example, an amorphous oxide having at least one or more of indium (In), zinc (Zn), gallium (Ga), tin (Sn) and hafnium (Hf). For example, the oxide semiconductive layer may include an amorphous oxide having indium (In), zinc (Zn) and gallium (Ga), or amorphous oxide having indium (In), zinc (Zn) and hafnium (Hf). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaSnO). The oxide semiconductive layer may include, for example, an oxide such as indium zinc oxide (InZnO), indium gallium oxide (InGaO), indium tin oxide (InSnO), tin zinc oxide (ZnSnO), tin gallium oxide (GaSnO) and tin gallium oxide (GaZnO). For example, the oxide semiconductive layer may include indium gallium zinc oxide (IGZO). In addition, the oxide semiconductor layer may also be formed of other materials which include, for example, an oxide semiconductor doped with a metal such as aluminum (Al), nickel (Ni), copper (Cu), tantalum (Ta), molybdenum (Mo), hafnium (Hf), titanium (Ti), niobium (Nb), chromium Cr, tungsten (W). Exemplary embodiments of the present invention are not limited to any of the above-mentioned materials for the oxide semiconductor layer.

Figure 15E:
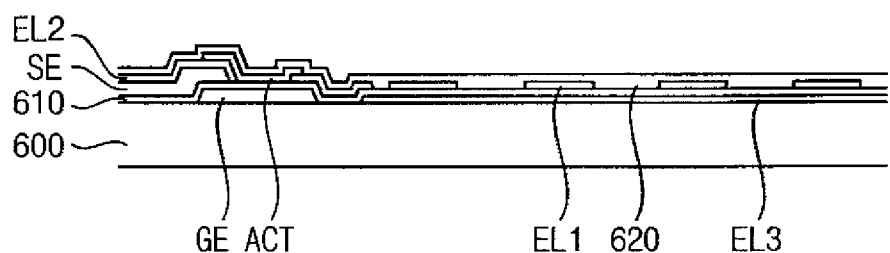

Referring to FIG. 15E, a second insulating layer 620 is formed on the first electrode EL1, the active layer ACT and the second electrode EL2. The second insulating layer 620 may be formed, for example, by using a transparent organic material such as an acrylic resin or benzocyclobutene (BCB) or a transparent inorganic material such as silicon oxide (SiOx), silicon nitride (SiNx) or a combination thereof. The second insulating layer 620 may be formed by, for example, a plasma chemical vapor deposition or an organic film coating process. In addition, the second insulating layer 420 may be formed as, for example, a double layer structure having layers formed of different materials and by different processes than each other.

According to example embodiments of the present invention, an array substrate includes a second electrode, and the second electrode covers a side of a metal layer such as a source electrode, so that a second insulating layer disposed on the metal layer may be formed at a respectively high temperature. Thus, an active layer may be protected from being contaminated by a material from the metal layer. Consequently, the reliability of the array substrate may be increased.

In addition, a void caused by different etch rates of polarity of metal layers during patterning the metal layers may be reduced, because the second electrode EL2 covers the sides of the metal layers. Therefore, a second insulating layer disposed on the second electrode EL2 may be uniformly formed.

Having described example embodiments of the present invention, it is readily apparent to those of ordinary skill in the art that various modifications may be made without departing from the sprit and scope of the invention which is defined by the metes and bounds of the appended claims.

What is claimed is:

1. An array substrate comprising:
   a thin film transistor comprising a gate electrode electrically connected to a gate line, a source electrode electrically connected to a data line, a drain electrode and an active layer;
   a first electrode electrically connected to the drain electrode and disposed at a pixel area; and
   a second electrode covering an upper surface and a side surface of the source electrode,
   wherein the second electrode separates the source electrode from the active layer, and
   wherein the source electrode is spaced apart from the first electrode.

2. The array substrate of claim 1, wherein the second electrode contacts the source electrode.

3. The array substrate of claim 1, wherein the first electrode and the second electrode comprise a same material as each other.

4. The array substrate of claim 3, wherein the first electrode covers an upper surface and a side surface of the drain electrode.

5. The array substrate of claim 2, further comprising a first insulating layer disposed on the gate line and the gate electrode, and a second insulating layer disposed on the first electrode and the second electrode, wherein the first insulating layer insulates the gate line and the gate electrode, wherein the second insulating layer insulates the first electrode and the second electrode, wherein the gate line comprises a lower gate line comprising at least one of gallium doped zinc oxide (GZO) or indium doped zinc oxide (IZO), and an upper gate line comprising copper (Cu), wherein the data line comprises a lower data line comprising at least one of gallium doped zinc oxide (GZO) or indium doped zinc oxide (IZO), and wherein an upper data line comprises copper (Cu), wherein the first insulating layer comprises a lower first insulating layer comprising silicon nitride (SiNx), and an upper first insulating layer comprising silicon oxide (SiOx), and wherein the second insulating layer comprises a lower second insulating layer comprising silicon oxide (SiOx), and an upper second insulating layer comprising silicon nitride (SiNx).

6. The array substrate of claim 5, further comprising a third electrode disposed on the second insulating layer, and wherein the third electrode has a slit pattern.

7. The array substrate of claim 5, further comprising a third electrode disposed under the first insulating layer, and wherein the first electrode has a slit pattern.

8. The array substrate of claim 1, wherein the drain electrode and the first electrode are formed from a same layer as each other.

9. The array substrate of claim 1, wherein the active layer comprises an amorphous oxide of at least one selected from the group consisting of indium (In), zinc (Zn), gallium (Ga), tin (Sn) and hafnium (Hf).

10. The array substrate of claim 1, wherein a portion of the active layer is disposed on the second electrode.

11. The array substrate of claim 5, wherein the second electrode covers a side of the lower data line and a side of the upper data line.

12. A display panel comprising:
    an array substrate comprising:
       a thin film transistor comprising a gate electrode electrically connected to a gate line, a source electrode electrically connected to a data line, a drain electrode and an active layer, a first electrode electrically connected to the drain electrode and disposed at a pixel area in which an image is displayed, and a second electrode covering an upper surface and a side surface of the source electrode, wherein the second electrode separates the source electrode from the active layer, and wherein the second electrode is spaced apart from the first electrode;
    an opposite substrate facing the array substrate with a black matrix disposed under the opposite substrate, wherein the black matrix overlaps with an area of the array substrate except for the pixel area of the array substrate;
    a liquid crystal layer disposed between the array substrate and the opposite substrate, wherein liquid crystal molecules of the liquid crystal layer have optical anisotropy; and
    a color filter disposed on one of the opposite substrate or the array substrate.

13. The display panel of claim 12, wherein the black matrix overlaps with the thin film transistor.

14. The display panel of claim 13, wherein the color filter is disposed on the opposite substrate underneath the black matrix.

* * * * *